United States Patent
Costa et al.

(10) Patent No.: US 11,551,998 B2
(45) Date of Patent: Jan. 10, 2023

(54) RF DEVICES WITH ENHANCED PERFORMANCE AND METHODS OF FORMING THE SAME

(71) Applicant: Qorvo US, Inc., Greensboro, NC (US)

(72) Inventors: Julio C. Costa, Oak Ridge, NC (US); Michael Carroll, Jamestown, NC (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 16/426,527

(22) Filed: May 30, 2019

(65) Prior Publication Data

US 2020/0006193 A1    Jan. 2, 2020

Related U.S. Application Data

(60) Provisional application No. 62/692,945, filed on Jul. 2, 2018.

(51) Int. Cl.
*H01L 23/42* (2006.01)
*H01L 23/31* (2006.01)
(Continued)

(52) U.S. Cl.
CPC ............ *H01L 23/42* (2013.01); *H01L 21/561* (2013.01); *H01L 21/568* (2013.01);
(Continued)

(58) Field of Classification Search
CPC . H01L 23/3135; H01L 23/3107; H01L 23/42; H01L 23/315; H01L 23/66;
(Continued)

(56) References Cited

U.S. PATENT DOCUMENTS 4,093,562 A    6/1978 Kishimoto
4,366,202 A    12/1982 Borovsky
(Continued)

FOREIGN PATENT DOCUMENTS

CN      1696231 A    11/2005
CN    101901953 A    12/2010
(Continued)

OTHER PUBLICATIONS

First Office Action for Chinese Patent Application No. 201680058198. 6, dated Dec. 29, 2020, 14 pages.
(Continued)

*Primary Examiner* — Marcos D. Pizarro
*Assistant Examiner* — Antonio B Crite
(74) *Attorney, Agent, or Firm* — Withrow & Terranova, P.L.L.C.

(57) ABSTRACT

The present disclosure relates to a radio frequency device that includes a device region with a back-end-of-line (BEOL) portion and a front-end-of-line (FEOL) portion, first bump structures, a first mold compound, and a second mold compound. The FEOL portion includes an active layer, a contact layer, and isolation sections. Herein, the active layer and the isolation sections reside over the contact layer, and the active layer is surrounded by the isolation sections. The BEOL portion is formed underneath the FEOL portion, and the first bump structures and the first mold compound are formed underneath the BEOL portion. Each first bump structure is partially encapsulated by the first mold compound, and electrically coupled to the FEOL portion via connecting layers within the BEOL portion. The second mold compound resides over the active layer without a silicon material, which has a resistivity between 5 Ohm-cm and 30000 Ohm-cm, in between.

14 Claims, 7 Drawing Sheets

Figure 1:
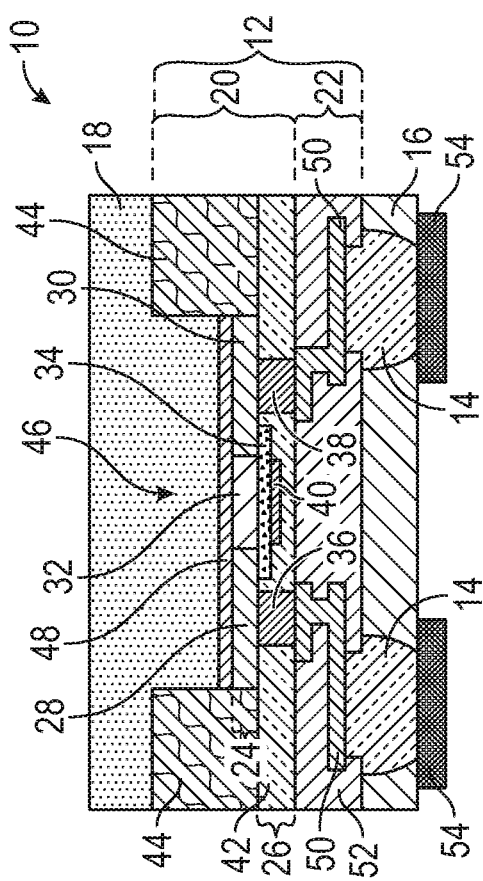

(51) Int. Cl.
  *H01L 23/522* (2006.01)
  *H01L 23/66* (2006.01)
  *H01L 23/00* (2006.01)
  *H01L 21/56* (2006.01)
  *H01L 21/762* (2006.01)

(52) U.S. Cl.
  CPC ........ *H01L 21/762* (2013.01); *H01L 23/3135* (2013.01); *H01L 23/5226* (2013.01); *H01L 23/66* (2013.01); *H01L 24/11* (2013.01); *H01L 24/13* (2013.01); *H01L 24/14* (2013.01); *H01L 24/73* (2013.01); *H01L 2224/1319* (2013.01); *H01L 2224/13024* (2013.01); *H01L 2224/13147* (2013.01); *H01L 2224/141* (2013.01); *H01L 2224/73104* (2013.01); *H01L 2924/014* (2013.01)

(58) Field of Classification Search
  CPC ......... H01L 24/20; H01L 24/13; H01L 24/14; H01L 24/95; H01L 21/762; H01L 21/56; H01L 27/1203; H01L 2224/13024; H01L 2224/73104; H01L 2224/04105; H01L 2224/12105; H01L 2924/181; H01L 23/5389; H01L 23/5226
  See application file for complete search history.

(56) References Cited

U.S. PATENT DOCUMENTS

| | | |
|---|---|---|
| 5,013,681 A | 5/1991 | Godbey et al. |
| 5,061,663 A | 10/1991 | Bolt et al. |
| 5,069,626 A | 12/1991 | Patterson et al. |
| 5,164,687 A | 11/1992 | Kurian et al. |
| 5,294,295 A | 3/1994 | Gabriel |
| 5,362,972 A | 11/1994 | Yazawa et al. |
| 5,391,257 A | 2/1995 | Sullivan et al. |
| 5,459,368 A | 10/1995 | Onishi et al. |
| 5,646,432 A | 7/1997 | Iwaki et al. |
| 5,648,013 A | 7/1997 | Uchida et al. |
| 5,699,027 A | 12/1997 | Tsuji et al. |
| 5,709,960 A | 1/1998 | Mays et al. |
| 5,729,075 A | 3/1998 | Strain |
| 5,831,369 A | 11/1998 | Fürbacher et al. |
| 5,920,142 A | 7/1999 | Onishi et al. |
| 6,072,557 A | 6/2000 | Kishimoto |
| 6,084,284 A | 7/2000 | Adamic, Jr. |
| 6,154,366 A | 11/2000 | Ma et al. |
| 6,154,372 A | 11/2000 | Kalivas et al. |
| 6,235,554 B1 | 5/2001 | Akram et al. |
| 6,236,061 B1 | 5/2001 | Walpita |
| 6,268,654 B1 | 7/2001 | Glenn et al. |
| 6,271,469 B1 | 8/2001 | Ma et al. |
| 6,377,112 B1 | 4/2002 | Rozsypal |
| 6,423,570 B1 | 7/2002 | Ma et al. |
| 6,426,559 B1 | 7/2002 | Bryan et al. |
| 6,441,498 B1 | 8/2002 | Song |
| 6,446,316 B1 | 9/2002 | Fürbacher et al. |
| 6,578,458 B1 | 6/2003 | Akram et al. |
| 6,649,012 B2 | 11/2003 | Masayuki et al. |
| 6,703,688 B1 | 3/2004 | Fitzergald |
| 6,713,859 B1 | 3/2004 | Ma |
| 6,841,413 B2 | 1/2005 | Liu et al. |
| 6,864,156 B1 | 3/2005 | Conn |
| 6,902,950 B2 | 6/2005 | Ma et al. |
| 6,943,429 B1 | 9/2005 | Glenn et al. |
| 6,964,889 B2 | 11/2005 | Ma et al. |
| 6,992,400 B2 | 1/2006 | Tikka et al. |
| 7,042,072 B1 | 5/2006 | Kim et al. |
| 7,049,692 B2 | 5/2006 | Nishimura et al. |
| 7,064,391 B1 | 6/2006 | Conn |
| 7,109,635 B1 | 9/2006 | McClure et al. |
| 7,183,172 B2 | 2/2007 | Lee et al. |
| 7,190,064 B2 | 3/2007 | Wakabayashi et al. |
| 7,238,560 B2 | 7/2007 | Sheppard et al. |
| 7,279,750 B2 | 10/2007 | Jobetto |
| 7,288,435 B2 | 10/2007 | Aigner et al. |
| 7,307,003 B2 | 12/2007 | Reif et al. |
| 7,393,770 B2 | 7/2008 | Wood et al. |
| 7,402,901 B2 | 7/2008 | Hatano et al. |
| 7,427,824 B2 | 9/2008 | Iwamoto et al. |
| 7,489,032 B2 | 2/2009 | Jobetto |
| 7,596,849 B1 | 10/2009 | Carpenter et al. |
| 7,619,347 B1 | 11/2009 | Bhattacharjee |
| 7,635,636 B2 | 12/2009 | McClure et al. |
| 7,714,535 B2 | 5/2010 | Yamazaki et al. |
| 7,723,838 B2 | 5/2010 | Takeuchi et al. |
| 7,749,882 B2 | 7/2010 | Kweon et al. |
| 7,790,543 B2 | 9/2010 | Abadeer et al. |
| 7,816,231 B2 | 10/2010 | Dyer et al. |
| 7,843,072 B1 | 11/2010 | Park et al. |
| 7,855,101 B2 | 12/2010 | Furman et al. |
| 7,868,419 B1 | 1/2011 | Kerr et al. |
| 7,910,405 B2 | 3/2011 | Okada et al. |
| 7,955,955 B2 | 6/2011 | Lane et al. |
| 7,960,218 B2 | 6/2011 | Ma et al. |
| 8,004,089 B2 | 8/2011 | Jobetto |
| 8,183,151 B2 | 5/2012 | Lake |
| 8,299,633 B2 | 10/2012 | Su |
| 8,420,447 B2 | 4/2013 | Tay et al. |
| 8,503,186 B2 | 8/2013 | Lin et al. |
| 8,563,403 B1 | 10/2013 | Farooq et al. |
| 8,643,148 B2 | 2/2014 | Lin et al. |
| 8,658,475 B1 | 2/2014 | Kerr |
| 8,664,044 B2 | 3/2014 | Jin et al. |
| 8,772,853 B2 | 7/2014 | Hong et al. |
| 8,791,532 B2 | 7/2014 | Graf et al. |
| 8,802,495 B2 | 8/2014 | Kim et al. |
| 8,803,242 B2 | 8/2014 | Marino et al. |
| 8,816,407 B2 | 8/2014 | Kim et al. |
| 8,835,978 B2 | 9/2014 | Mauder et al. |
| 8,906,755 B1 | 12/2014 | Hekmatshoartabari et al. |
| 8,921,990 B2 | 12/2014 | Park et al. |
| 8,927,968 B2 | 1/2015 | Cohen et al. |
| 8,941,248 B2 | 1/2015 | Lin et al. |
| 8,963,321 B2 | 2/2015 | Lenniger et al. |
| 8,983,399 B2 | 3/2015 | Kawamura et al. |
| 9,064,883 B2 | 6/2015 | Meyer et al. |
| 9,165,793 B1 | 10/2015 | Wang et al. |
| 9,214,337 B2 | 12/2015 | Carroll et al. |
| 9,349,700 B2 | 5/2016 | Hsieh et al. |
| 9,368,429 B2 | 6/2016 | Ma et al. |
| 9,406,637 B2 | 8/2016 | Wakisaka et al. |
| 9,461,001 B1 | 10/2016 | Tsai et al. |
| 9,520,428 B2 | 12/2016 | Fujimori |
| 9,530,709 B2 | 12/2016 | Leipold et al. |
| 9,613,831 B2 | 4/2017 | Morris et al. |
| 9,646,856 B2 | 5/2017 | Meyer et al. |
| 9,653,428 B1 | 5/2017 | Hiner et al. |
| 9,698,081 B2 | 7/2017 | Yu et al. |
| 9,786,586 B1 | 10/2017 | Shih |
| 9,812,350 B2 | 11/2017 | Costa |
| 9,824,951 B2 | 11/2017 | Leipold et al. |
| 9,824,974 B2 | 11/2017 | Gao et al. |
| 9,859,254 B1 | 1/2018 | Yu et al. |
| 9,875,971 B2 | 1/2018 | Bhushan et al. |
| 9,941,245 B2 | 4/2018 | Skeete et al. |
| 10,134,837 B1 | 11/2018 | Fanelli et al. |
| 10,727,212 B2 | 7/2020 | Moon et al. |
| 10,784,348 B2 | 9/2020 | Fanelli et al. |
| 10,882,740 B2 | 1/2021 | Costa et al. |
| 2001/0004131 A1 | 6/2001 | Masayuki et al. |
| 2002/0070443 A1 | 6/2002 | Mu et al. |
| 2002/0074641 A1 | 6/2002 | Towle et al. |
| 2002/0127769 A1 | 9/2002 | Ma et al. |
| 2002/0127780 A1 | 9/2002 | Ma et al. |
| 2002/0137263 A1 | 9/2002 | Towle et al. |
| 2002/0185675 A1 | 12/2002 | Furukawa |
| 2003/0207515 A1 | 11/2003 | Tan et al. |
| 2004/0021152 A1 | 2/2004 | Nguyen et al. |
| 2004/0164367 A1 | 8/2004 | Park |
| 2004/0166642 A1 | 8/2004 | Chen et al. |
| 2004/0219765 A1 | 11/2004 | Reif et al. |

(56) References Cited

U.S. PATENT DOCUMENTS

| | | |
|---|---|---|
| 2004/0266159 A1 | 12/2004 | Gardecki et al. |
| 2005/0037595 A1 | 2/2005 | Nakahata |
| 2005/0077511 A1 | 4/2005 | Fitzergald |
| 2005/0079686 A1 | 4/2005 | Aigner et al. |
| 2005/0212419 A1 | 9/2005 | Vazan et al. |
| 2005/0258447 A1 | 11/2005 | Oi et al. |
| 2006/0057782 A1 | 3/2006 | Gardes et al. |
| 2006/0099781 A1 | 5/2006 | Beaumont et al. |
| 2006/0105496 A1 | 5/2006 | Chen et al. |
| 2006/0108585 A1 | 5/2006 | Gan et al. |
| 2006/0228074 A1 | 10/2006 | Lipson et al. |
| 2006/0261446 A1 | 11/2006 | Wood et al. |
| 2007/0020807 A1 | 1/2007 | Geefay et al. |
| 2007/0045738 A1 | 3/2007 | Jones et al. |
| 2007/0069393 A1 | 3/2007 | Asahi et al. |
| 2007/0075317 A1 | 4/2007 | Kato et al. |
| 2007/0121326 A1 | 5/2007 | Nall et al. |
| 2007/0158746 A1 | 7/2007 | Ohguro |
| 2007/0181992 A1 | 8/2007 | Lake |
| 2007/0190747 A1 | 8/2007 | Humpston et al. |
| 2007/0194342 A1 | 8/2007 | Kinzer |
| 2007/0252481 A1 | 11/2007 | Iwamoto et al. |
| 2007/0276092 A1 | 11/2007 | Kanae et al. |
| 2008/0020513 A1 | 1/2008 | Jobetto |
| 2008/0050852 A1 | 2/2008 | Hwang et al. |
| 2008/0050901 A1 | 2/2008 | Kweon et al. |
| 2008/0164528 A1 | 7/2008 | Cohen et al. |
| 2008/0251927 A1 | 10/2008 | Zhao et al. |
| 2008/0265978 A1 | 10/2008 | Englekirk |
| 2008/0272497 A1 | 11/2008 | Lake |
| 2008/0277800 A1 | 11/2008 | Hwang et al. |
| 2008/0315372 A1 | 12/2008 | Kuan et al. |
| 2009/0008714 A1 | 1/2009 | Chae |
| 2009/0010056 A1 | 1/2009 | Kuo et al. |
| 2009/0014856 A1 | 1/2009 | Knickerbocker |
| 2009/0090979 A1 | 4/2009 | Zhu et al. |
| 2009/0179266 A1 | 7/2009 | Abadeer et al. |
| 2009/0230542 A1 | 9/2009 | Lin et al. |
| 2009/0243097 A1 | 10/2009 | Koroku et al. |
| 2009/0261460 A1 | 10/2009 | Kuan et al. |
| 2009/0302484 A1 | 12/2009 | Lee et al. |
| 2010/0003803 A1 | 1/2010 | Oka et al. |
| 2010/0012354 A1 | 1/2010 | Hedin et al. |
| 2010/0029045 A1 | 2/2010 | Ramanathan et al. |
| 2010/0045145 A1 | 2/2010 | Tsuda |
| 2010/0081232 A1 | 4/2010 | Furman et al. |
| 2010/0081237 A1 | 4/2010 | Wong et al. |
| 2010/0109122 A1 | 5/2010 | Ding et al. |
| 2010/0120204 A1 | 5/2010 | Kunimoto |
| 2010/0127340 A1 | 5/2010 | Sugizaki |
| 2010/0173436 A1 | 7/2010 | Ouellet et al. |
| 2010/0200919 A1 | 8/2010 | Kikuchi |
| 2010/0314637 A1 | 12/2010 | Kim et al. |
| 2011/0003433 A1 | 1/2011 | Harayama et al. |
| 2011/0026232 A1 | 2/2011 | Lin et al. |
| 2011/0036400 A1 | 2/2011 | Murphy et al. |
| 2011/0062549 A1 | 3/2011 | Lin |
| 2011/0068433 A1 | 3/2011 | Kim et al. |
| 2011/0102002 A1 | 5/2011 | Riehl et al. |
| 2011/0171792 A1 | 7/2011 | Chang et al. |
| 2011/0227158 A1 | 9/2011 | Zhu |
| 2011/0272800 A1 | 11/2011 | Chino |
| 2011/0272824 A1 | 11/2011 | Pagaila |
| 2011/0294244 A1 | 12/2011 | Hattori et al. |
| 2012/0003813 A1 | 1/2012 | Chuang et al. |
| 2012/0045871 A1 | 2/2012 | Lee et al. |
| 2012/0068276 A1 | 3/2012 | Lin et al. |
| 2012/0094418 A1 | 4/2012 | Grama et al. |
| 2012/0098074 A1 | 4/2012 | Lin et al. |
| 2012/0104495 A1 | 5/2012 | Zhu et al. |
| 2012/0119346 A1 | 5/2012 | Im et al. |
| 2012/0153393 A1 | 6/2012 | Liang et al. |
| 2012/0168863 A1 | 7/2012 | Zhu et al. |
| 2012/0256260 A1 | 10/2012 | Cheng et al. |
| 2012/0292700 A1 | 11/2012 | Khakifirooz et al. |
| 2012/0299105 A1 | 11/2012 | Cai et al. |
| 2013/0001665 A1 | 1/2013 | Zhu et al. |
| 2013/0015429 A1 | 1/2013 | Hong et al. |
| 2013/0049205 A1* | 2/2013 | Meyer ............... H01L 24/13 257/773 |
| 2013/0099315 A1 | 4/2013 | Zhu et al. |
| 2013/0105966 A1 | 5/2013 | Kelkar et al. |
| 2013/0147009 A1 | 6/2013 | Kim |
| 2013/0155681 A1 | 6/2013 | Nall et al. |
| 2013/0196483 A1 | 8/2013 | Dennard et al. |
| 2013/0200456 A1 | 8/2013 | Zhu et al. |
| 2013/0221493 A1 | 8/2013 | Kim et al. |
| 2013/0241040 A1* | 9/2013 | Tojo ............... H01L 23/49844 257/666 |
| 2013/0280826 A1 | 10/2013 | Scanlan et al. |
| 2013/0299871 A1 | 11/2013 | Mauder et al. |
| 2014/0015131 A1 | 1/2014 | Meyer et al. |
| 2014/0035129 A1 | 2/2014 | Stuber et al. |
| 2014/0134803 A1 | 5/2014 | Kelly et al. |
| 2014/0168014 A1 | 6/2014 | Chih et al. |
| 2014/0197530 A1 | 7/2014 | Meyer et al. |
| 2014/0210314 A1 | 7/2014 | Bhattacharjee et al. |
| 2014/0219604 A1 | 8/2014 | Hackler, Sr. et al. |
| 2014/0252566 A1 | 9/2014 | Kerr et al. |
| 2014/0252567 A1 | 9/2014 | Carroll et al. |
| 2014/0264813 A1 | 9/2014 | Lin et al. |
| 2014/0264818 A1 | 9/2014 | Lowe, Jr. et al. |
| 2014/0306324 A1 | 10/2014 | Costa et al. |
| 2014/0323064 A1 | 10/2014 | McCarthy |
| 2014/0327003 A1 | 11/2014 | Fuergut et al. |
| 2014/0327150 A1 | 11/2014 | Jung et al. |
| 2014/0346573 A1 | 11/2014 | Adam et al. |
| 2014/0356602 A1 | 12/2014 | Oh et al. |
| 2015/0015321 A1 | 1/2015 | Dribinsky et al. |
| 2015/0021754 A1 | 1/2015 | Lin et al. |
| 2015/0060956 A1 | 3/2015 | Chen |
| 2015/0097302 A1* | 4/2015 | Wakisaka ............ H01L 21/561 257/784 |
| 2015/0108666 A1 | 4/2015 | Engelhardt et al. |
| 2015/0115416 A1 | 4/2015 | Costa et al. |
| 2015/0130045 A1 | 5/2015 | Tseng et al. |
| 2015/0136858 A1 | 5/2015 | Finn et al. |
| 2015/0171006 A1 | 6/2015 | Hung et al. |
| 2015/0197419 A1 | 7/2015 | Cheng et al. |
| 2015/0235990 A1 | 8/2015 | Cheng et al. |
| 2015/0235993 A1 | 8/2015 | Cheng et al. |
| 2015/0243881 A1 | 8/2015 | Sankman et al. |
| 2015/0255368 A1 | 9/2015 | Costa |
| 2015/0262844 A1 | 9/2015 | Meyer et al. |
| 2015/0279789 A1 | 10/2015 | Mahajan et al. |
| 2015/0311132 A1 | 10/2015 | Kuo et al. |
| 2015/0364344 A1 | 12/2015 | Yu et al. |
| 2015/0380394 A1 | 12/2015 | Jang et al. |
| 2015/0380523 A1 | 12/2015 | Hekmatshoartabari et al. |
| 2016/0002510 A1 | 1/2016 | Champagne et al. |
| 2016/0056544 A1 | 2/2016 | Garcia et al. |
| 2016/0079137 A1 | 3/2016 | Leipold et al. |
| 2016/0093580 A1 | 3/2016 | Scanlan et al. |
| 2016/0100489 A1 | 4/2016 | Costa et al. |
| 2016/0126111 A1 | 5/2016 | Leipold et al. |
| 2016/0126196 A1 | 5/2016 | Leipold et al. |
| 2016/0133591 A1 | 5/2016 | Hong et al. |
| 2016/0155706 A1 | 6/2016 | Yoneyama et al. |
| 2016/0284568 A1 | 9/2016 | Morris et al. |
| 2016/0284570 A1 | 9/2016 | Morris et al. |
| 2016/0300771 A1 | 10/2016 | Lin |
| 2016/0343592 A1* | 11/2016 | Costa ............... H01L 23/3135 |
| 2016/0343604 A1 | 11/2016 | Costa et al. |
| 2016/0347609 A1 | 12/2016 | Yu et al. |
| 2016/0362292 A1 | 12/2016 | Chang et al. |
| 2017/0024503 A1 | 1/2017 | Connelly |
| 2017/0032957 A1 | 2/2017 | Costa et al. |
| 2017/0033026 A1 | 2/2017 | Ho et al. |
| 2017/0053938 A1 | 2/2017 | Whitefield |
| 2017/0062366 A1 | 3/2017 | Enquist |
| 2017/0077028 A1 | 3/2017 | Maxim et al. |
| 2017/0098587 A1 | 4/2017 | Leipold et al. |
| 2017/0190572 A1 | 7/2017 | Pan et al. |
| 2017/0200648 A1 | 7/2017 | Lee et al. |

(56) References Cited

U.S. PATENT DOCUMENTS

| | | |
|---|---|---|
| 2017/0207350 A1 | 7/2017 | Leipold et al. |
| 2017/0263539 A1 | 9/2017 | Gowda et al. |
| 2017/0271200 A1 | 9/2017 | Costa |
| 2017/0323804 A1 | 11/2017 | Costa et al. |
| 2017/0323860 A1 | 11/2017 | Costa et al. |
| 2017/0334710 A1 | 11/2017 | Costa et al. |
| 2017/0358511 A1 | 12/2017 | Costa et al. |
| 2018/0019184 A1 | 1/2018 | Costa et al. |
| 2018/0019185 A1 | 1/2018 | Costa et al. |
| 2018/0044169 A1 | 2/2018 | Hatcher, Jr. et al. |
| 2018/0044177 A1 | 2/2018 | Vandemeer et al. |
| 2018/0047653 A1 | 2/2018 | Costa et al. |
| 2018/0076174 A1 | 3/2018 | Costa et al. |
| 2018/0138082 A1 | 5/2018 | Costa et al. |
| 2018/0138227 A1 | 5/2018 | Shimotsusa et al. |
| 2018/0145678 A1 | 5/2018 | Maxim et al. |
| 2018/0166358 A1 | 6/2018 | Costa et al. |
| 2018/0269188 A1 | 9/2018 | Yu et al. |
| 2019/0013254 A1 | 1/2019 | Costa et al. |
| 2019/0013255 A1 | 1/2019 | Costa et al. |
| 2019/0043812 A1 | 2/2019 | Leobandung |
| 2019/0074263 A1 | 3/2019 | Costa et al. |
| 2019/0074271 A1 | 3/2019 | Costa et al. |
| 2019/0172826 A1 | 6/2019 | Or-Bach et al. |
| 2019/0172842 A1 | 6/2019 | Whitefield |
| 2019/0189599 A1 | 6/2019 | Baloglu et al. |
| 2019/0229101 A1 | 7/2019 | Lee |
| 2019/0287953 A1 | 9/2019 | Moon et al. |
| 2019/0304910 A1 | 10/2019 | Fillion |
| 2019/0312110 A1 | 10/2019 | Costa et al. |
| 2019/0326159 A1 | 10/2019 | Costa et al. |
| 2019/0378819 A1 | 12/2019 | Costa et al. |
| 2020/0058541 A1 | 2/2020 | Konishi et al. |
| 2020/0235059 A1 | 7/2020 | Cok et al. |
| 2021/0348078 A1 | 11/2021 | Haramoto et al. |

FOREIGN PATENT DOCUMENTS

| | | |
|---|---|---|
| CN | 102956468 A | 3/2013 |
| CN | 103811474 A | 5/2014 |
| CN | 103872012 A | 6/2014 |
| CN | 106098609 A | 11/2016 |
| EP | 1098386 A1 | 5/2001 |
| EP | 2996143 A1 | 3/2016 |
| JP | S505733 Y1 | 2/1975 |
| JP | S5338954 A | 4/1978 |
| JP | H11-220077 A | 8/1999 |
| JP | 200293957 A | 3/2002 |
| JP | 2002252376 A | 9/2002 |
| JP | 2004273604 A | 9/2004 |
| JP | 2004327557 A | 11/2004 |
| JP | 2006005025 A | 1/2006 |
| JP | 2007227439 A | 9/2007 |
| JP | 2008235490 A | 10/2008 |
| JP | 2008279567 A | 11/2008 |
| JP | 2009026880 A | 2/2009 |
| JP | 2009530823 A | 8/2009 |
| JP | 2009200274 A | 9/2009 |
| JP | 2009302526 A | 12/2009 |
| JP | 2011216780 A | 10/2011 |
| JP | 2011243596 A | 12/2011 |
| JP | 2012129419 A | 7/2012 |
| JP | 2012156251 A | 8/2012 |
| JP | 2013162096 A | 8/2013 |
| JP | 2013222745 A | 10/2013 |
| JP | 2013254918 A | 12/2013 |
| JP | 2014509448 A | 4/2014 |
| TW | 201733056 A | 9/2017 |
| WO | 2007074651 A1 | 7/2007 |
| WO | 2018083961 A1 | 5/2018 |
| WO | 2018125242 A1 | 7/2018 |

OTHER PUBLICATIONS

International Preliminary Report on Patentability for International Patent Application No. PCT/US2019/034645, dated Jan. 14, 2021, 9 pages.
Notice of Allowance for U.S. Appl. No. 15/873,152, dated May 11, 2020, 8 pages.
Corrected Notice of Allowability for U.S. Appl. No. 15/695,579, dated May 20, 2020, 4 pages.
Notice of Allowability for U.S. Appl. No. 15/695,579, dated Jun. 25, 2020, 4 pages.
Notice of Allowance for U.S. Appl. No. 16/004,961, dated Apr. 30, 2020, 8 pages.
Notice of Allowance for U.S. Appl. No. 16/368,210, dated Jun. 17, 2020, 10 pages.
Non-Final Office Action for U.S. Appl. No. 16/374,125, dated Jun. 26, 2020, 12 pages.
Non-Final Office Action for U.S. Appl. No. 16/390,496, dated Jul. 10, 2020, 17 pages.
Non-Final Office Action for U.S. Appl. No. 16/204,214, dated May 19, 2020, 15 pages.
Non-Final Office Action for U.S. Appl. No. 16/454,687, dated May 15, 2020, 14 pages.
Non-Final Office Action for U.S. Appl. No. 16/454,809, dated May 15, 2020, 12 pages.
Welser, J. et al., "Electron Mobility Enhancement in Strained-Si N-Type Metal-Oxide-Semiconductor Field-Effect Transistors," IEEE Electron Device Letters, vol. 15, No. 3, Mar. 1994, IEEE, pp. 100-102.
Zeng, X. et al., "A Combination of Boron Nitride Nanotubes and Cellulose Nanofibersfor the Preparation of a Nanocomposite with High Thermal Conductivity," ACS Nano, vol. 11, No. 5, 2017, American Chemical Society, pp. 5167-5178.
Examination Report for European Patent Application No. 16751791.1, dated Apr. 30, 2020, 15 pages.
Notification of Reasons for Refusal for Japanese Patent Application No. 2018-526613, dated May 11, 2020, 6 pages.
Examination Report for Singapore Patent Application No. 11201901193U, dated May 26, 2020, 6 pages.
International Search Report and Written Opinion for International Patent Application No. PCT/US2020/014662, dated May 7, 2020, 18 pages.
International Search Report and Written Opinion for International Patent Application No. PCT/US2020/014665, dated May 13, 2020, 17 pages.
International Search Report and Written Opinion for International Patent Application No. PCT/US2020/014666, dated Jun. 4, 2020, 18 pages.
International Search Report and Written Opinion for International Patent Application No. PCT/US2020/014667, dated May 18, 2020, 14 pages.
International Search Report and Written Opinion for International Patent Application No. PCT/US2020/014669, dated Jun. 4, 2020, 15 pages.
Quayle Action for U.S. Appl. No. 16/703,251, dated Jun. 26, 2020, 5 pages.
Dhar, S. et al., "Electron Mobility Model for Strained-Si Devices," IEEE Transactions on Electron Devices, vol. 52, No. 4, Apr. 2005, IEEE, pp. 527-533.
Notice of Allowance for U.S. Appl. No. 16/038,879, dated Apr. 15, 2020, 9 pages.
Notice of Allowance for U.S. Appl. No. 15/816,637, dated Apr. 2, 2020, 8 pages.
Corrected Notice of Allowability for U.S. Appl. No. 15/695,579, dated Feb. 5, 2020, 5 pages.
Corrected Notice of Allowability for U.S. Appl. No. 15/695,579, dated Apr. 1, 2020, 4 pages.
Notice of Allowance for U.S. Appl. No. 16/527,702, dated Apr. 9, 2020, 8 pages.
Final Office Action for U.S. Appl. No. 16/204,214, dated Mar. 6, 2020, 14 pages.
Advisory Action for U.S. Appl. No. 16/204,214, dated Apr. 15, 2020, 3 pages.

(56) References Cited

OTHER PUBLICATIONS

Decision of Rejection for Japanese Patent Application No. 2015-180657, dated Mar. 17, 2020, 4 pages.
Intention to Grant for European Patent Application No. 17757646.9, dated Feb. 27, 2020, 55 pages.
International Search Report and Written Opinion for International Patent Application No. PCT/US2019/063460, dated Feb. 25, 2020, 14 pages.
International Search Report and Written Opinion for International Patent Application No. PCT/US2019/055317, dated Feb. 6, 2020, 17 pages.
International Search Report and Written Opinion for International Patent Application No. PCT/US2019/055321, dated Jan. 27, 2020, 23 pages.
Non-Final Office Action for U.S. Appl. No. 15/676,693, dated May 3, 2018, 14 pages.
Notice of Allowance for U.S. Appl. No. 15/789,107, dated May 18, 2018, 8 pages.
Final Office Action for U.S. Appl. No. 15/616,109, dated Apr. 19, 2018, 18 pages.
Notice of Allowance for U.S. Appl. No. 15/676,693, dated Jul. 20, 2018, 8 pages.
Notice of Allowance for U.S. Appl. No. 15/695,629, dated Jul. 11, 2018, 12 pages.
Notice of Allowance for U.S. Appl. No. 15/387,855, dated Aug. 10, 2018, 7 pages.
Notice of Allowance for U.S. Appl. No. 15/914,538, dated Aug. 1, 2018, 9 pages.
Notice of Allowance and Applicant-Initiated Interview Summary for U.S. Appl. No. 15/262,457, dated Sep. 28, 2018, 16 pages.
Corrected Notice of Allowance for U.S. Appl. No. 15/676,693, dated Aug. 29, 2018, 5 pages.
Final Office Action for U.S. Appl. No. 15/601,858, dated Nov. 26, 2018, 16 pages.
Non-Final Office Action for U.S. Appl. No. 15/945,418, dated Nov. 1, 2018, 13 pages.
First Office Action for Chinese Patent Application No. 201510746323.X, dated Nov. 2, 2018, 12 pages.
Advisory Action for U.S. Appl. No. 15/601,858, dated Jan. 22, 2019, 3 pages.
Notice of Allowance for U.S. Appl. No. 16/038,879, dated Jan. 9, 2019, 8 pages.
Notice of Allowance for U.S. Appl. No. 16/004,961, dated Jan. 11, 2019, 8 pages.
International Preliminary Report on Patentability for PCT/US2017/046744, dated Feb. 21, 2019, 11 pages.
International Preliminary Report on Patentability for PCT/US2017/046758, dated Feb. 21, 2019, 11 pages.
International Preliminary Report on Patentability for PCT/US2017/046779, dated Feb. 21, 2019, 11 pages.
Non-Final Office Action for U.S. Appl. No. 15/992,613, dated Feb. 27, 2019, 15 pages.
Non-Final Office Action for U.S. Appl. No. 15/695,579, dated Jan. 28, 2019, 8 pages.
Notice of Allowance for U.S. Appl. No. 15/992,639, dated May 9, 2019, 7 pages.
Notice of Allowance for U.S. Appl. No. 15/695,579, dated Mar. 20, 2019, 8 pages.
Notice of Allowance for U.S. Appl. No. 16/004,961, dated May 13, 2019, 8 pages.
Non-Final Office Action for U.S. Appl. No. 15/601,858, dated Apr. 17, 2019, 9 pages.
Tsai, Chun-Lin, et al., "Smart GaN platform; Performance & Challenges," IEEE International Electron Devices Meeting, 2017, 4 pages.
Tsai, Szu-Ping., et al., "Performance Enhancement of Flip-Chip Packaged AIGAaN/GaN HEMTs by Strain Engineering Design," IEEE Transcations on Electron Devices, vol. 63, Issue 10, Oct. 2016, pp. 3876-3881.

Final Office Action for U.S. Appl. No. 15/992,613, dated May 24, 2019, 11 pages.
Non-Final Office Action for U.S. Appl. No. 15/873,152, dated May 24, 2019, 11 pages.
Notice of Allowance for U.S. Appl. No. 16/168,327, dated Jun. 28, 2019, 7 pages.
Lin, Yueh, Chin, et al., "Enhancement-Mode GaN MIS-HEMTs With LaHfOx Gate Insulator for Power Application," IEEE Electronic Device Letters, vol. 38, Issue 8, 2017, 4 pages.
Shukla, Shishir, et al., "GaN-on-Si Switched Mode RF Power Amplifiers for Non-Constant Envelope Signals," IEEE Topical Conference on RF/Microwave Power Amplifiers for Radio and Wireless Applications, 2017, pp. 88-91.
International Search Report and Written Opinion for International Patent Application No. PCT/US19/25591, dated Jun. 21, 2019, 7 pages.
Notice of Reasons for Refusal for Japanese Patent Application No. 2015-180657, dated Jul. 9, 2019, 4 pages.
Notice of Allowance for U.S. Appl. No. 15/601,858, dated Aug. 16, 2019, 8 pages.
Advisory Action for U.S. Appl. No. 15/992,613, dated Jul. 29, 2019, 3 pages.
Final Office Action for U.S. Appl. No. 15/873,152, dated Aug. 8, 2019, 13 pages.
Notice of Allowance for U.S. Appl. No. 15/975,230, dated Jul. 22, 2019, 7 pages.
Notice of Allowance for U.S. Appl. No. 16/004,961, dated Aug. 28, 2019, 8 pages.
Notice of Allowance for U.S. Appl. No. 15/287,273, dated Jun. 30, 2017, 8 pages.
Corrected Notice of Allowability for U.S. Appl. No. 15/287,273, dated Jul. 21, 2017, 5 pages.
Supplemental Notice of Allowability for U.S. Appl. No. 15/287,273, dated Sep. 7, 2017, 5 pages.
Extended European Search Report for European Patent Application No. 15184861.1, dated Jan. 25, 2016, 6 pages.
Office Action of the Intellectual Property Office for Taiwanese Patent Application No. 104130224, dated Jun. 15, 2016, 9 pages.
Non-Final Office Action for U.S. Appl. No. 14/885,202, dated Apr. 14, 2016, 5 pages.
Final Office Action for U.S. Appl. No. 14/885,202, dated Sep. 27, 2016, 7 pages.
Advisory Action for U.S. Appl. No. 14/885,202, dated Nov. 29, 2016, 3 pages.
Notice of Allowance for U.S. Appl. No. 14/885,202, dated Jan. 27, 2017, 7 pages.
Notice of Allowance for U.S. Appl. No. 14/885,202, dated Jul. 24, 2017, 8 pages.
Notice of Allowance for U.S. Appl. No. 14/885,243, dated Aug. 31, 2016, 8 pages.
Non-Final Office Action for U.S. Appl. No. 12/906,689, dated May 27, 2011, 13 pages.
Non-Final Office Action for U.S. Appl. No. 12/906,689, dated Nov. 4, 2011, 20 pages.
Search Report for Japanese Patent Application No. 2011-229152, created on Feb. 22, 2013, 58 pages.
Office Action for Japanese Patent Application No. 2011-229152, dated May 10, 2013, 7 pages.
Final Rejection for Japanese Patent Application No. 2011-229152, dated Oct. 25, 2013, 2 pages.
International Search Report and Written Opinion for PCT/US2016/045809, dated Oct. 7, 2016, 11 pages.
Non-Final Office Action for U.S. Appl. No. 15/652,867, dated Oct. 10, 2017, 5 pages.
Bernheim et al., "Chapter 9: Lamination," Tools and Manufacturing Engineers Handbook (book), Apr. 1, 1996, Society of Manufacturing Engineers, p. 9-1.
Fillion R. et al., "Development of a Plastic Encapsulated Multichip Technology for High Volume, Low Cost Commercial Electronics," Electronic Components and Technology Conference, vol. 1, May 1994, IEEE, 5 pages.

(56) References Cited

OTHER PUBLICATIONS

Henawy, Mahmoud Al et al., "New Thermoplastic Polymer Substrate for Microstrip Antennas at 60 GHz," German Microwave Conference, Mar. 15-17, 2010, Berlin, Germany, IEEE, pp. 5-8.
International Search Report and Written Opinion for PCT/US2017/046744, dated Nov. 27, 2017, 17 pages.
International Search Report and Written Opinion for PCT/US2017/046758, dated Nov. 16, 2017, 19 pages.
International Search Report and Written Opinion for PCT/US2017/046779, dated Nov. 29, 2017, 17 pages.
Non-Final Office Action for U.S. Appl. No. 15/616,109, dated Oct. 23, 2017, 16 pages.
Corrected Notice of Allowability for U.S. Appl. No. 14/851,652, dated Oct. 20, 2017, 5 pages.
Final Office Action for U.S. Appl. No. 15/262,457, dated Dec. 19, 2017, 12 pages.
Supplemental Notice of Allowability and Applicant-Initiated Interview Summary for U.S. Appl. No. 15/287,273, dated Oct. 18, 2017, 6 pages.
Supplemental Notice of Allowability for U.S. Appl. No. 15/287,273, dated Nov. 2, 2017, 5 pages.
Non-Final Office Action for U.S. Appl. No. 15/491,064, dated Jan. 2, 2018, 9 pages.
Notice of Allowance for U.S. Appl. No. 14/872,910, dated Nov. 17, 2017, 11 pages.
Notice of Allowance for U.S. Appl. No. 15/648,082, dated Nov. 29, 2017, 8 pages.
Non-Final Office Action for U.S. Appl. No. 15/652,826, dated Nov. 3, 2017, 5 pages.
Notice of Allowance for U.S. Appl. No. 15/229,780, dated Oct. 3, 2017, 7 pages.
Supplemental Notice of Allowability for U.S. Appl. No. 15/287,273, dated Jan. 17, 2018, 5 pages.
Notice of Allowance for U.S. Appl. No. 15/498,040, dated Feb. 20, 2018, 8 pages.
Non-Final Office Action for U.S. Appl. No. 15/387,855, dated Jan. 16, 2018, 7 pages.
Non-Final Office Action for U.S. Appl. No. 15/795,915, dated Feb. 23, 2018, 6 pages.
International Preliminary Report on Patentability for PCT/US2016/045809, dated Feb. 22, 2018, 8 pages.
Advisory Action and Applicant-Initiated Interview Summary for U.S. Appl. No. 15/262,457, dated Feb. 28, 2018, 5 pages.
Supplemental Notice of Allowability for U.S. Appl. No. 15/287,273, dated Feb. 23, 2018, 5 pages.
Non-Final Office Action for U.S. Appl. No. 15/676,415, dated Mar. 27, 2018, 14 page.
Non-Final Office Action for U.S. Appl. No. 15/676,621, dated Mar. 26, 2018, 16 pages.
Notice of Allowance for U.S. Appl. No. 15/795,915, dated Jun. 15, 2018, 7 pages.
Final Office Action for U.S. Appl. No. 15/387,855, dated May 24, 2018, 9 pages.
Non-Final Office Action for U.S. Appl. No. 15/262,457, dated Apr. 19, 2018, 10 pages.
Notice of Allowance for U.S. Appl. No. 15/491,064, dated Apr. 30, 2018, 9 pages.
Non-Final Office Action for U.S. Appl. No. 15/601,858, dated Jun. 26, 2018, 12 pages.
Notice of Allowance for U.S. Appl. No. 15/616,109, dated Jul. 2, 2018, 7 pages.
Notice of Allowance for U.S. Appl. No. 15/676,621, dated Jun. 5, 2018, 8 pages.
Notice of Allowance for U.S. Appl. No. 16/703,251, dated Aug. 27, 2020, 8 pages.
Notice of Allowance for U.S. Appl. No. 16/454,687, dated Aug. 14, 2020, 7 pages.
Final Office Action for U.S. Appl. No. 16/454,809, dated Aug. 21, 2020, 12 pages.
Advisory Action for U.S. Appl. No. 16/454,809, dated Oct. 23, 2020, 3 pages.
Decision to Grant for Japanese Patent Application No. 2018-526613, dated Aug. 17, 2020, 5 pages.
International Preliminary Report on Patentability for International Patent Application No. PCT/US2019/025591, dated Oct. 15, 2020, 6 pages.
Raskin, Jean-Pierre et al., "Substrate Crosstalk Reduction Using SOI Technology," IEEE Transactions on Electron Devices, vol. 44, No. 12, Dec. 1997, pp. 2252-2261.
Rong, B., et al., "Surface-Passivated High-Resistivity Silicon Substrates for RFICs," IEEE Electron Device Letters, vol. 25, No. 4, Apr. 2004, pp. 176-178.
Sherman, Lilli M., "Plastics that Conduct Heat," Plastics Technology Online, Jun. 2001, Retrieved May 17, 2016, http://www.ptonline.com/articles/plastics-that-conduct-heat, Gardner Business Media, Inc., 5 pages.
Tombak, A., et al., "High-Efficiency Cellular Power Amplifiers Based on a Modified LDMOS Process on Bulk Silicon and Silicon-On-Insulator Substrates with Integrated Power Management Circuitry," IEEE Transactions on Microwave Theory and Techniques, vol. 60, No. 6, Jun. 2012, pp. 1862-1869.
Yamanaka, A., et al., "Thermal Conductivity of High-Strength Polyetheylene Fiber and Applications for Cryogenic Use," International Scholarly Research Network, ISRN Materials Science, vol. 2011, Article ID 718761, May 25, 2011, 10 pages.
Non-Final Office Action for U.S. Appl. No. 13/852,648, dated Jul. 18, 2013, 20 pages.
Final Office Action for U.S. Appl. No. 13/852,648, dated Nov. 26, 2013, 21 pages.
Applicant-Initiated Interview Summary for U.S. Appl. No. 13/852,648, dated Jan. 27, 2014, 4 pages.
Advisory Action for U.S. Appl. No. 13/852,648, dated Mar. 7, 2014, 4 pages.
Notice of Allowance for U.S. Appl. No. 13/852,648, dated Jun. 16, 2014, 9 pages.
Notice of Allowance for U.S. Appl. No. 13/852,648, dated Sep. 26, 2014, 8 pages.
Notice of Allowance for U.S. Appl. No. 13/852,648, dated Jan. 22, 2015, 8 pages.
Non-Final Office Action for U.S. Appl. No. 13/852,648, dated Jun. 24, 2015, 20 pages.
Final Office Action for U.S. Appl. No. 13/852,648, dated Oct. 22, 2015, 20 pages.
Non-Final Office Action for U.S. Appl. No. 13/852,648, dated Feb. 19, 2016, 12 pages.
Final Office Action for U.S. Appl. No. 13/852,648, dated Jul. 20, 2016, 14 pages.
Non-Final Office Action for U.S. Appl. No. 14/315,765, dated Jan. 2, 2015, 6 pages.
Final Office Action for U.S. Appl. No. 14/315,765, dated May 11, 2015, 17 pages.
Advisory Action for U.S. Appl. No. 14/315,765, dated Jul. 22, 2015, 3 pages.
Non-Final Office Action for U.S. Appl. No. 14/260,909, dated Mar. 20, 2015, 20 pages.
Final Office Action for U.S. Appl. No. 14/260,909, dated Aug. 12, 2015, 18 pages.
Non-Final Office Action for U.S. Appl. No. 14/261,029, dated Dec. 5, 2014, 15 pages.
Notice of Allowance for U.S. Appl. No. 14/261,029, dated Apr. 27, 2015, 10 pages.
Corrected Notice of Allowability for U.S. Appl. No. 14/261,029, dated Nov. 17, 2015, 5 pages.
Non-Final Office Action for U.S. Appl. No. 14/529,870, dated Feb. 12, 2016, 14 pages.
Notice of Allowance for U.S. Appl. No. 14/529,870, dated Jul. 15, 2016, 8 pages.
Non-Final Office Action for U.S. Appl. No. 15/293,947, dated Apr. 7, 2017, 12 pages.
Notice of Allowance for U.S. Appl. No. 15/293,947, dated Aug. 14, 2017, 7 pages.

(56) References Cited

OTHER PUBLICATIONS

Non-Final Office Action for U.S. Appl. No. 14/715,830, dated Apr. 13, 2016, 16 pages.
Final Office Action for U.S. Appl. No. 14/715,830, dated Sep. 6, 2016, 13 pages.
Advisory Action for U.S. Appl. No. 14/715,830, dated Oct. 31, 2016, 6 pages.
Notice of Allowance for U.S. Appl. No. 14/715,830, dated Feb. 10, 2017, 8 pages.
Notice of Allowance for U.S. Appl. No. 14/715,830, dated Mar. 2, 2017, 8 pages.
Non-Final Office Action for U.S. Appl. No. 14/851,652, dated Oct. 7, 2016, 10 pages.
Notice of Allowance for U.S. Appl. No. 14/851,652, dated Apr. 11, 2017, 9 pages.
Corrected Notice of Allowance for U.S. Appl. No. 14/851,652, dated Jul. 24, 2017, 6 pages.
Corrected Notice of Allowance for U.S. Appl. No. 14/851,652, dated Sep. 6, 2017, 5 pages.
Notice of Allowance for U.S. Appl. No. 14/959,129, dated Oct. 11, 2016, 8 pages.
Non-Final Office Action for U.S. Appl. No. 15/173,037, dated Jan. 10, 2017, 8 pages.
Final Office Action for U.S. Appl. No. 15/173,037, dated May 2, 2017, 13 pages.
Advisory Action for U.S. Appl. No. 15/173,037, dated Jul. 20, 2017, 3 pages.
Notice of Allowance for U.S. Appl. No. 15/173,037, dated Aug. 9, 2017, 7 pages.
Non-Final Office Action for U.S. Appl. No. 15/085,185, dated Feb. 15, 2017, 10 pages.
Non-Final Office Action for U.S. Appl. No. 15/085,185, dated Jun. 6, 2017, 5 pages.
Non-Final Office Action for U.S. Appl. No. 15/229,780, dated Jun. 30, 2017, 12 pages.
Non-Final Office Action for U.S. Appl. No. 15/262,457, dated Aug. 7, 2017, 10 pages.
Notice of Allowance for U.S. Appl. No. 15/408,560, dated Sep. 25, 2017, 8 pages.
Notice of Allowance for U.S. Appl. No. 15/287,202, dated Aug. 25, 2017, 11 pages.
Non-Final Office Action for U.S. Appl. No. 15/353,346, dated May 23, 2017, 15 pages.
Notice of Allowance for U.S. Appl. No. 15/353,346, dated Sep. 25, 2017, 9 pages.
Notice of Allowance for U.S. Appl. No. 16/527,702, dated Nov. 13, 2020, 8 pages.
Notice of Allowance for U.S. Appl. No. 16/374,125, dated Dec. 16, 2020, 9 pages.
Final Office Action for U.S. Appl. No. 16/390,496, dated Dec. 24, 2020, 21 pages.
Final Office Action for U.S. Appl. No. 16/204,214, dated Nov. 30, 2020, 15 pages.
Notice of Allowance for U.S. Appl. No. 16/454,809, dated Nov. 25, 2020, 8 pages.
Non-Final Office Action for U.S. Appl. No. 16/427,019, dated Nov. 19, 2020, 19 pages.
Office Action for Japanese Patent Application No. 2018-526613, dated Nov. 5, 2019, 8 pages.
Notice of Allowance for U.S. Appl. No. 15/873,152, dated Dec. 10, 2019, 9 pages.
Non-Final Office Action for U.S. Appl. No. 16/527,702, dated Jan. 10, 2020, 10 pages.
Fiorenza, et al., "Detailed Simulation Study of a Reverse Embedded-SiGE Strained-Silicon MOSFET," IEEE Transactions on Electron Devices, vol. 55, Issue 2, Feb. 2008, pp. 640-648.
Fiorenza, et al., "Systematic study of thick strained silicon NMOSFETs for digital applications," International SiGE Technology and Device Meeting, May 2006, IEEE, 2 pages.
Huang, et al., "Carrier Mobility Enhancement in Strained Si-On-Insulator Fabricated by Wafer Bonding," Symposium on VLSI Technology, Digest of Technical Papers, 2001, pp. 57-58.
Nan, et al., "Effect of Germanium content on mobility enhancement for strained silicon FET," Student Conference on Research and Development, Dec. 2017, IEEE, pp. 154-157.
Sugil, Nobuyuki, et al., "Performance Enhancement of Strained-Si MOSFETs Fabricated on a Chemical-Mechanical-Polished SiGE Substrate," IEEE Transactions on Electron Devices, vol. 49, Issue 12, Dec. 2002, pp. 2237-2243.
Yin, Haizhou, et al., "Fully-depleted Strained-Si on Insulator NMOSFETs without Relaxed SiGe Buffers," International Electron Devices Meeting, Dec. 2003, San Francisco, California, IEEE, 4 pages.
U.S. Appl. No. 16/368,210, filed Mar. 28, 2019.
U.S. Appl. No. 16/004,961, filed Jun. 11, 2018.
U.S. Appl. No. 16/374,125, filed Apr. 3, 2019.
U.S. Appl. No. 16/390,496, filed Apr. 22, 2019.
Ali, K. Ben et al., "RF SOI CMOS Technology on Commercial Trap-Rich High Resistivity SOI Wafer," 2012 IEEE International SOI Conference (SOI), Oct. 1-4, 2012, Napa, California, IEEE, 2 pages.
Anderson, D.R. "Thermal Conductivity of Polymers," Sandia Corporation, Mar. 8, 1966, pp. 677-690.
Author Unknown, "96% Alumina, thick-film, as fired," MatWeb, Date Unknown, date accessed Apr. 6, 2016, 2 pages, http://www.matweb.com/search/DataSheet.aspx?MatGUID=3996a734395a4870a9739076918c4297&ckck=1.
Author Unknown, "CoolPoly D5108 Thermally Conductive Polyphenylene Sulfide (PPS)," Cool Polymers, Inc., Aug. 8, 2007, 2 pages.
Author Unknown, "CoolPoly D5506 Thermally Conductive Liquid Crystalline Polymer (LCP)," Cool Polymers, Inc., Dec. 12, 2013, 2 pages.
Author Unknown, "CoolPoly D-Series—Thermally Conductive Dielectric Plastics," Cool Polymers, Retrieved Jun. 24, 2013, http://coolpolymers.com/dseries.asp, 1 page.
Author Unknown, "CoolPoly E2 Thermally Conductive Liquid Crystalline Polymer (LCP)," Cool Polymers, Inc., Aug. 8, 2007, http://www.coolpolymers.com/Files/DS/Datasheet_e2.pdf, 1 page.
Author Unknown, "CoolPoly E3605 Thermally Conductive Polyamide 4,6 (PA 4,6)," Cool Polymers, Inc., Aug. 4, 2007, 1 page, http://www.coolpolymers.com/Files/DS/Datasheet_e3605.pdf.
Author Unknown, "CoolPoly E5101 Thermally Conductive Polyphenylene Sulfide (PPS)," Cool Polymers, Inc., Aug. 27, 2007, 1 page, http://www.coolpolymers.com/Files/DS/Datasheet_e5101.pdf.
Author Unknown, "CoolPoly E5107 Thermally Conductive Polyphenylene Sulfide (PPS)," Cool Polymers, Inc., Aug. 8, 2007, 1 page, http://coolpolymers.com/Files/DS/Datasheet_e5107.pdf.
Author Unknown, "CoolPoly Selection Tool," Cool Polymers, Inc., 2006, 1 page, http://www.coolpolymers.com/select.asp?Application=Substrates+%26+Electcronic_Packaging.
Author Unknown, "CoolPoly Thermally Conductive Plastics for Dielectric Heat Plates," Cool Polymers, Inc., 2006, 2 pages, http://www.coolpolymers.com/heatplate.asp.
Author Unknown, "CoolPoly Thermally Conductive Plastics for Substrates and Electronic Packaging," Cool Polymers, Inc., 2005, 1 page.
Author Unknown, "Electrical Properties of Plastic Materials," Professional Plastics, Oct. 28, 2011, http://www.professionalplastics.com/professionalplastics/ElectricalPropertiesofPlastics.pdf, accessed Dec. 18, 2014, 4 pages.
Author Unknown, "Fully Sintered Ferrite Powders," Powder Processing and Technology, LLC, Date Unknown, 1 page.
Author Unknown, "Heat Transfer," Cool Polymers, Inc., 2006, http://www.coolpolymers.com/heattrans.html, 2 pages.
Author Unknown, "Hysol UF3808," Henkel Corporation, Technical Data Sheet, May 2013, 2 pages.
Author Unknown, "PolyOne Therma-Tech™ LC-5000C TC LCP," MatWeb, Date Unknown, date accessed Apr. 6, 2016, 2 pages., http://www.matweb.com/search/datasheettext.aspx?matguid=89754e8bb26148d083c5ebb05a0cbff1.

(56) References Cited

OTHER PUBLICATIONS

Author Unknown, "Sapphire Substrate," from CRC Handbook of Chemistry and Physics, Date Unknown, 1 page.
Author Unknown, "Thermal Properties of Plastic Materials," Professional Plastics, Aug. 21, 2010, http://www.professionalplastics.com/professionalplastics/ThermalPropertiesofPlasticMaterials.pdf, accessed Dec. 18, 2014, 4 pages.
Author Unknown, "Thermal Properties of Solids," PowerPoint Presentation, No Date, 28 slides, http://www.phys.huji.ac.il/Phys_Hug/Lectures/77602/PHONONS_2_thermal.pdf.
Author Unknown, "Thermal Resistance & Thermal Conductance," C-Therm Technologies Ltd., accessed Sep. 19, 2013, 4 pages, http://www.ctherm.com/products/tci_thermal_conductivity/helpful_links_tools/thermal_resistance_thermal_conductance/.
Author Unknown, "The Technology: AKHAN's Approach and Solution: The Miraj Diamond™ Platform," 2015, accessed Oct. 9, 2016, http://www.akhansemi.com/technology.html#the-miraj-diamond-platform, 5 pages.
Beck, D., et al., "CMOS on FZ-High Resistivity Substrate for Monolithic Integration of SiGe-RF-Circuitry and Readout Electronics," IEEE Transactions on Electron Devices, vol. 44, No. 7, Jul. 1997, pp. 1091-1101.
Botula, A., et al., "A Thin-Film SOI 180nm CMOS RF Switch Technology," IEEE Topical Meeting on Silicon Monolithic Integrated Circuits in RF Systems, (SiRF '09), Jan. 2009, pp. 1-4.
Carroll, M., et al., "High-Resistivity SOI CMOS Cellular Antenna Switches," Annual IEEE Compound Semiconductor Integrated Circuit Symposium, (CISC 2009), Oct. 2009, pp. 1-4.
Colinge, J.P., et al., "A Low-Voltage, Low-Power Microwave SOI MOSFET," Proceedings of 1996 IEEE International SOI Conference, Oct. 1996, pp. 128-129.
Costa, J. et al., "Integrated MEMS Switch Technology on SOI-CMOS," Proceedings of Hilton Head Workshop: A Solid-State Sensors, Actuators and Microsystems Workshop, Jun. 1-5, 2008, Hilton Head Island, SC, IEEE, pp. 900-903.
Costa, J. et al., "Silicon RFCMOS SOI Technology with Above-IC MEMS Integration for Front End Wireless Applications," Bipolar/BiCMOS Circuits and Technology Meeting, 2008, BCTM 2008, IEEE, pp. 204-207.
Costa, J., "RFCMOS SOI Technology for 4G Reconfigurable RF Solutions," Session WEC1-2, Proceedings of the 2013 IEEE International Microwave Symposium, 4 pages.
Esfeh, Babak Kazemi et al., "RF Non-Linearities from Si-Based Substrates," 2014 International Workshop on Integrated Nonlinear Microwave and Millimetre-wave Circuits (INMMiC), Apr. 2-4, 2014, IEEE, 3 pages.
Finne, R. M. et al., "A Water-Amine-Complexing Agent System for Etching Silicon," Journal of the Electrochemical Society, vol. 114, No. 9, Sep. 1967, pp. 965-970.
Gamble, H. S. et al., "Low-Loss CPW Lines on Surface Stabilized High-Resistivity Silicon," IEEE Microwave and Guided Wave Letters, vol. 9, No. 10, Oct. 1999, pp. 395-397.
Huang, Xingyi, et al., "A Review of Dielectric Polymer Composites with High Thermal Conductivity," IEEE Electrical Insulation Magazine, vol. 27, No. 4, Jul./Aug. 2011, pp. 8-16.
Joshi, V. et al., "MEMS Solutions in RF Applications," 2013 IEEE SOI-3D-Subthreshold Microelectronics Technology Unified Conference (S3S), Oct. 2013, IEEE, 2 pages.
Jung, Boo Yang, et al., "Study of FCMBGA with Low CTE Core Substrate," 2009 Electronic Components and Technology Conference, May 2009, pp. 301-304.
Kerr, D.C., et al., "Identification of RF Harmonic Distortion on Si Substrates and its Reduction Using a Trap-Rich Layer," IEEE Topical Meeting on Silicon Monolithic Integrated Circuits in RF Systems, (SiRF 2008), Jan. 2008, pp. 151-154.
Lederer, D., et al., "New Substrate Passivation Method Dedicated to HR SOI Wafer Fabrication with Increased Substrate Resistivity," IEEE Electron Device Letters, vol. 26, No. 11, Nov. 2005, pp. 805-807.
Lederer, Dimitri et al., "Substrate loss mechanisms for microstrip and CPW transmission lines on lossy silicon wafers," Solid-State Electronics, vol. 47, No. 11, Nov. 2003, pp. 1927-1936.
Lee, Kwang Hong et al., "Integration of III-V materials and Si-CMOS through double layer transfer process," Japanese Journal of Applied Physics, vol. 54, Jan. 2015, pp. 030209-1 to 030209-5.
Lee Tzung-Yin, et al., "Modeling of SOI FET for RF Switch Applications," IEEE Radio Frequency Integrated Circuits Symposium, May 23-25, 2010, Anaheim, CA, IEEE, pp. 479-482.
Lu, J.Q., et al., "Evaluation Procedures for Wafer Bonding and Thinning of Interconnect Test Structures for 3D ICs," Proceedings of the IEEE 2003 International Interconnect Technology Conference, Jun. 2-4, 2003, pp. 74-76.
Mamunya, Ye.P., et al., "Electrical and Thermal Conductivity of Polymers Filled with Metal Powders," European Polymer Journal, vol. 38, 2002, pp. 1887-1897.
Mansour, Raafat R., "RF MEMS-CMOS Device Integration," IEEE Microwave Magazine, vol. 14, No. 1, Jan. 2013, pp. 39-56.
Mazuré, C. et al., "Advanced SOI Substrate Manufacturing," 2004 IEEE International Conference on Integrated Circuit Design and Technology, 2004, IEEE, pp. 105-111.
Micak, R. et al, "Photo-Assisted Electrochemical Machining of Micromechanical Structures," Proceedings of Micro Electra Mechanical Systems, Feb. 7-10, 1993, Fort Lauderdale, FL, IEEE, pp. 225-229.
Morris, Art, "Monolithic Integration of RF-MEMS within CMOS," 2015 International Symposium on VLSI Technology, Systems and Application (VLSI-TSA), Apr. 27-29, 2015, IEEE, 2 pages.
Niklaus, F., et al., "Adhesive Wafer Bonding," Journal of Applied Physics, vol. 99, No. 3, 031101 (2006), 28 pages.
Parthasarathy, S., et al., "RF SOI Switch FET Design and Modeling Tradeoffs for GSM Applications," 2010 23rd International Conference on VLSI Design, (VLSID '10), Jan. 2010, pp. 194-199.
Raskin, J.P., et al., "Coupling Effects in High-Resistivity Simox Substrates for VHF and Microwave Applications," Proceedings of 1995 IEEE International SOI Conference, Oct. 1995, pp. 62-63.
International Search Report and Written Opinion for International Patent Application No. PCT/US2019/034645, dated Sep. 19, 2019, 14 pages.
International Search Report and Written Opinion for International Patent Application No. PCT/US2019/034699, dated Oct. 29, 2019, 13 pages.
Notice of Allowance for U.S. Appl. No. 15/992,613, dated Sep. 23, 2019, 7 pages.
Non-Final Office Action for U.S. Appl. No. 16/204,214, dated Oct. 9, 2019, 15 pages.
Non-Final Office Action for U.S. Appl. No. 15/816,637, dated Oct. 31, 2019, 10 pages.
Advisory Action for U.S. Appl. No. 15/873,152, dated Oct. 11, 2019, 3 pages.
Advisory Action for U.S. Appl. No. 16/390,496, dated Mar. 1, 2021, 3 pages.
Notice of Allowance for U.S. Appl. No. 16/390,496, dated Apr. 5, 2021, 7 pages.
Notice of Allowance for U.S. Appl. No. 16/204,214, dated Feb. 17, 2021, 11 pages.
Non-Final Office Action for U.S. Appl. No. 16/678,551, dated Apr. 7, 2021, 9 pages.
Non-Final Office Action for U.S. Appl. No. 16/678,573, dated Feb. 19, 2021, 11 pages.
Non-Final Office Action for U.S. Appl. No. 16/678,602, dated Feb. 19, 2021, 10 pages.
Supplementary Examination Report for Singapore Patent Application No. 11201901194S, dated Mar. 10, 2021, 3 pages.
International Preliminary Report on Patentability for International Patent Application No. PCT/US2019/055317, dated Apr. 22, 2021, 11 pages.
International Preliminary Report on Patentability for International Patent Application No. PCT/US2019/055321, dated Apr. 22, 2021, 14 pages.
Office Action for Taiwanese Patent Application No. 108140788, dated Mar. 25, 2021, 18 pages.

(56) References Cited

OTHER PUBLICATIONS

Applicant-Initiated Interview Summary for U.S. Appl. No. 16/678,573, dated May 7, 2021, 2 pages.
Final Office Action for U.S. Appl. No. 16/427,019, dated May 21, 2021, 16 pages.
Final Office Action and Examiner-Initiated Interview Summary for U.S. Appl. No. 16/678,551, dated Jun. 28, 2021, 9 pages.
Final Office Action and Examiner-Initiated Interview Summary for U.S. Appl. No. 16/678,573, dated Jun. 28, 2021, 10 pages.
Notice of Allowance for U.S. Appl. No. 16/678,619, dated Jul. 8, 2021, 10 pages.
Final Office Action for U.S. Appl. No. 16/678,602, dated Jun. 1, 2021, 9 pages.
Advisory Action for U.S. Appl. No. 16/427,019, dated Aug. 2, 2021, 3 pages.
Notice of Reasons for Refusal for Japanese Patent Application No. 2020119130, dated Jun. 29, 2021, 4 pages.
Notice of Reasons for Rejection for Japanese Patent Application No. 2019507765, dated Jun. 28, 2021, 4 pages.
Search Report for Japanese Patent Application No. 2019507768, dated Jul. 15, 2021, 42 pages.
Notice of Reasons for Refusal for Japanese Patent Application No. 2019507768, dated Jul. 26, 2021, 4 pages.
Reasons for Rejection for Japanese Patent Application No. 2019507767, dated Jun. 25, 2021, 5 pages.
International Preliminary Report on Patentability for International Patent Application No. PCT/US2019/063460, dated Jun. 10, 2021, 9 pages.
International Preliminary Report on Patentability for International Patent Application No. PCT/US2019/034699, dated Aug. 5, 2021, 9 pages.
International Preliminary Report on Patentability for International Patent Application No. PCT/US2020/014662, dated Aug. 5, 2021, 11 pages.
International Preliminary Report on Patent ability for International Patent Application No. PCT/US2020/014665, dated Aug. 5, 2021, 10 pages.
International Preliminary Report on Patentability for International Patent Application No. PCT/US2020/014666, dated Aug. 5, 2021, 11 pages.
International Preliminary Report on Patentability for International Patent Application No. PCT/US2020/014667, dated Aug. 5, 2021, 8 pages.
International Preliminary Report on Patentability for International Patent Application No. PCT/US2020/014669, dated Aug. 5, 2021, 9 pages.
Non-Final Office Action for U.S. Appl. No. 16/678,586, dated Aug. 12, 2021, 16 pages.
Notice of Allowance and Examiner-Initiated Interview Summary for U.S. Appl. No. 16/678,602, dated Aug. 12, 2021, 11 pages.
Decision to Grant for Japannese Patent Application No. 2020119130, dated Sep. 7, 2021, 4 pages.
Second Office Action for Chinese Patent Application No. 201680058198.6, dated Sep. 8, 2021, 8 pages.
Advisory Action and Examiner-Initiated Interview Summary for U.S. Appl. No. 16/678,551, dated Sep. 13, 2021, 3 pages.
Notice of Allowance and Examiner-Initiated Interview Summary for U.S. Appl. No. 16/678,551, dated Oct. 21, 2021, 8 pages.
Advisory Action and Examiner-Initiated Interview Summary for U.S. Appl. No. 16/678,573, dated Sep. 10, 2021, 3 pages.
Notice of Allowance and Examiner-Initiated Interview Summary for U.S. Appl. No. 16/678,573, dated Oct. 21, 2021, 7 pages.
Corrected Notice of Allowability for U.S. Appl. No. 16/678,602, dated Aug. 26, 2021, 4 pages.
Non-Final Office Action for U.S. Appl. No. 16/427,019, dated Dec. 2, 2021, 17 pages.
Corrected Notice of Allowability for U.S. Appl. No. 16/678,551, dated Nov. 24, 2021, 3 pages.
Corrected Notice of Allowability for U.S. Appl. No. 16/678,573, dated Nov. 24, 2021, 3 pages.
Final Office Action for U.S. Appl. No. 16/678,586, dated Nov. 22, 2021, 15 pages.
Corrected Notice of Allowability for U.S. Appl. No. 16/678,602, dated Nov. 24, 2021, 4 pages.
Corrected Notice of Allowability for U.S. Appl. No. 16/678,602, dated Dec. 30, 2021, 4 pages.
Borel, S. et al., "Control of Selectivity between SiGe and Si in Isotropic Etching Processes," Japanese Journal of Applied Physics, vol. 43, No. 6B, 2004, pp. 3964-3966.
Examination Report for European Patent Application No. 17755402.9, dated Dec. 20, 2021, 12 pages.
Examination Report for European Patent Application No. 17755403.7, dated Dec. 20, 2021, 13 pages.
International Search Report and Written Opinion for International Patent Application No. PCT/US2021/043968, dated Nov. 19, 2021, 15 pages.
Corrected Notice of Allowability for U.S. Appl. No. 16/678,551, dated Jan. 27, 2022, 3 pages.
Corrected Notice of Allowability for U.S. Appl. No. 16/678,573, dated Jan. 27, 2022, 3 pages.
Advisory Action for U.S. Appl. No. 16/678,586, dated Jan. 26, 2022, 3 pages.
Decision of Rejection for Chinese Patent Application No. 201680058198.6, dated Nov. 12, 2021, 6 pages.
Notice of Allowance for Japanese Patent Application No. 2019507767, dated Jan. 19, 2022, 6 pages.
Office Letter for Taiwanese Patent Application No. 108140788, dated Jan. 5, 2022, 16 pages.
Corrected Notice of Allowability for U.S. Appl. No. 16/678,551, dated Mar. 9, 2022, 3 pages.
Corrected Notice of Allowability for U.S. Appl. No. 16/678,573, dated Mar. 31, 2022, 3 pages.
Non-Final Office Action for U.S. Appl. No. 16/678,586, dated Mar. 3, 2022, 14 pages.
Corrected Notice of Allowability for U.S. Appl. No. 16/678,602, dated Feb. 2, 2022, 4 pages.
Corrected Notice of Allowability for U.S. Appl. No. 16/678,602, dated Mar. 9, 2022, 4 pages.
Non-Final Office Action for U.S. Appl. No. 16/844,406, dated Mar. 14, 2022, 16 pages.
Non-Final Office Action for U.S. Appl. No. 17/102,957, dated Feb. 17, 2022, 9 pages.
Summons to Attend for European Patent Application No. 16751791.1, dated Feb. 28, 2022, 10 pages.
Decision to Grant for Japanese Application No. 2019507765, dated Feb. 10, 2022, 6 pages.
Decision to Grant for Japanese Patent Application No. 2019507768, dated Feb. 10, 2022, 6 pages.
Final Office Action for U.S. Appl. No. 16/427,019, dated Apr. 12, 2022, 15 pages.
Adivsory Action for U.S. Appl. No. 16/427,019, dated Jun. 2, 2022, 3 pages.
Corrected Notice of Allowability for U.S. Appl. No. 16/678,551, dated May 13, 2022, 3 pages.
Corrected Notice of Allowability for U.S. Appl. No. 16/678,551, dated Jun. 15, 2022, 3 pages.
Corrected Notice of Allowability for U.S. Appl. No. 16/678,573, dated May 6, 2022, 3 pages.
Corrected Notice of Allowability for U.S. Appl. No. 16/678,573, dated Jun. 10, 2022, 3 pages.
Corrected Notice of Allowability for U.S. Appl. No. 16/678,602, dated Apr. 8, 2022, 4 pages.
Corrected Notice of Allowability for U.S. Appl. No. 16/678,602, dated May 13, 2022, 4 pages.
Corrected Notice of Allowability for U.S. Appl. No. 16/678,602, dated Jun. 10, 2022, 4 pages.
Notice of Allowance for U.S. Appl. No. 17/109,935, dated Apr. 20, 2022, 15 pages.
International Search Report and Written Opinion for International Patent Application No. PCT/US2021/063093, dated May 4, 2022, 15 pages.

(56) References Cited

OTHER PUBLICATIONS

Invitation to Pay Additional Fees and Partial International Search for International Patent Application No. PCT/US2021/063094, dated Apr. 19, 2022, 15 pages.
International Search Report and Written Opinion for International Patent Application No. PCT/US2021/062509, dated Mar. 29, 2022, 20 pages.
Notice of Allowance for U.S. Appl. No. 16/390,496, dated Oct. 27, 2022, 21 pages.
Notice of Allowance for U.S. Appl. No. 16/204,214, dated Oct. 28, 2022, 11 pages.
Corrected Notice of Allowability for U.S. Appl. No. 16/678,551, dated Oct. 4, 2022, 3 pages.
Corrected Notice of Allowability for U.S. Appl. No. 16/678,551, dated Nov. 2, 2022, 3 pages.
Notice of Allowance for U.S. Appl. No. 17/109,935, dated Oct. 28, 2022, 7 pages.
Corrected Notice of Allowability for U.S. Appl. No. 17/109,935, dated Nov. 10, 2022, 4 pages.
Notice of Reasons for Rejection for Japanese Patent Application No. 2022032477, dated Oct. 3, 2022, 4 pages.
Non-Final Office Action for U.S. Appl. No. 16/427,019, dated Aug. 15, 2022, 17 pages.
Corrected Notice of Allowability for U.S. Appl. No. 16/678,551, dated Jul. 14, 2022, 3 pages.
Final Office Action for U.S. Appl. No. 16/678,586, dated Sep. 1, 2022, 7 pages.
Corrected Notice of Allowability for U.S. Appl. No. 16/678,602, dated Jul. 14, 2022, 4 pages.
Final Office Action for U.S. Appl. No. 16/844,406, dated Jun. 24, 2022, 17 pages.
Advisory Action for U.S. Appl. No. 16/844,406, dated Jul. 26, 2022, 3 pages.
Corrected Notice of Allowability for U.S. Appl. No. 17/109,935, dated Jul. 1, 2022, 4 pages.
Corrected Notice of Allowability for U.S. Appl. No. 17/109,935, dated Jul. 27, 2022, 4 pages.
Final Office Action for U.S. Appl. No. 17/102,957, dated Aug. 18, 2022, 12 pages.
International Search Report and Written Opinion for International Patent Application No. PCT/US2021/063094, dated Aug. 9, 2022, 24 pages.
Corrected Notice of Allowability for U.S. Appl. No. 16/678,551, dated Sep. 2, 2022, 3 pages.
Corrected Notice of Allowability for U.S. Appl. No. 16/678,602, dated Sep. 2, 2022, 4 pages.
Non-Final Office Action for U.S. Appl. No. 17/330,787, dated Oct. 17, 2022, 10 pages.
Notice of Allowance and Examiner-Initiated Interview Summary for U.S. Appl. No. 16/678,586, dated Sep. 13, 2022, 11 pages.
Corrected Notice of Allowability for U.S. Appl. No. 16/678,602, dated Oct. 5, 2022, 4 pages.
Non-Final Office Action for U.S. Appl. No. 16/844,406, dated Oct. 6, 2022, 17 pages.
Corrected Notice of Allowability for U.S. Appl. No. 17/109,935, dated Sep. 14, 2022, 4 pages.
Notice of Preliminary Rejection for Korean Patent Application No. 10-2018-7006660, dated Sep. 3, 2022, 6 pages.
Advisory Action for U.S. Appl. No. 17/102,957, dated Oct. 27, 2022, 7 pages.

* cited by examiner

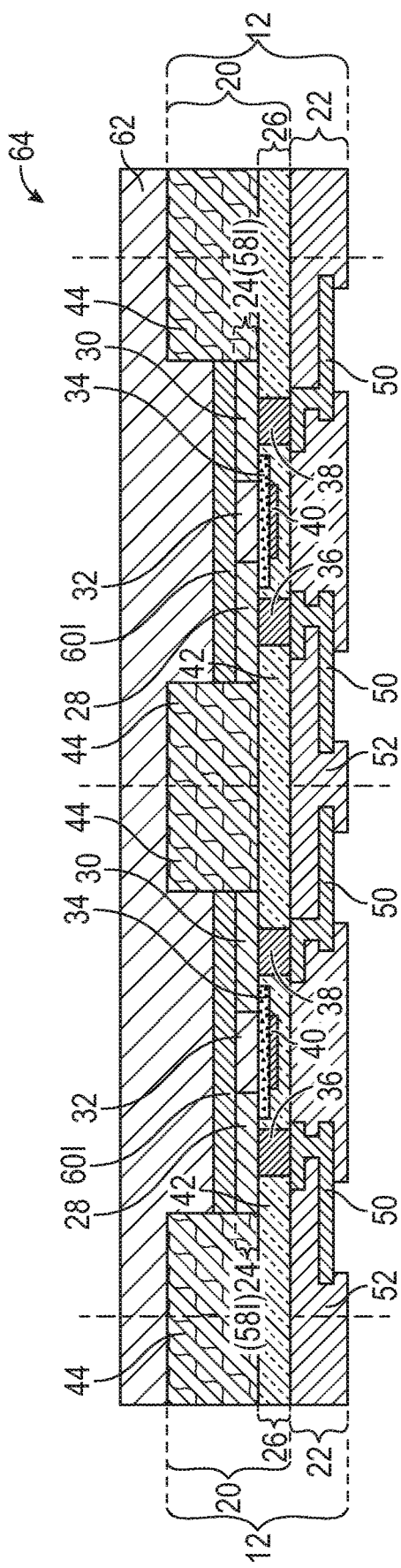
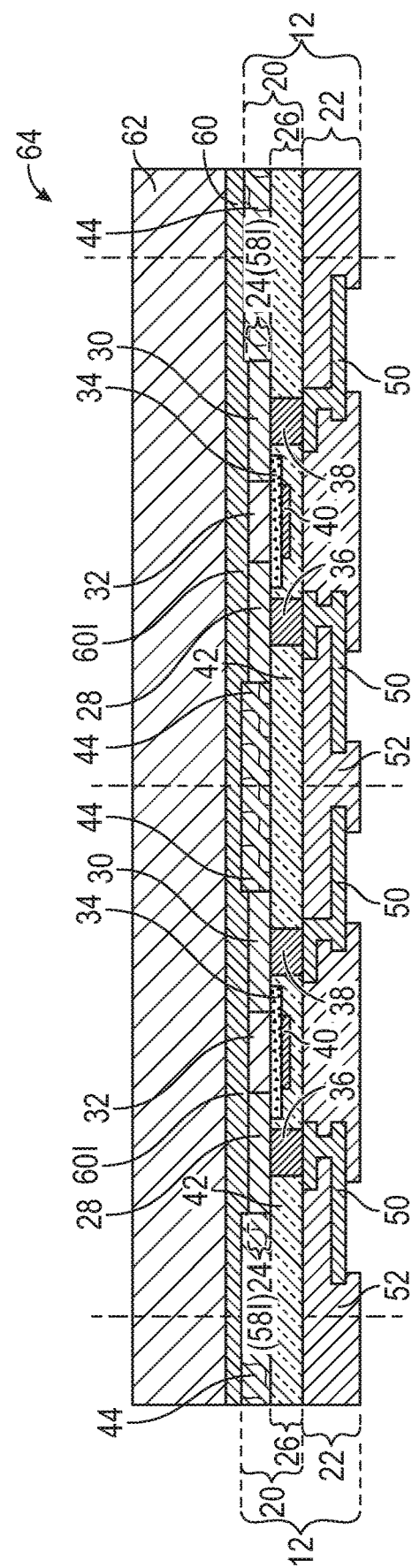
FIG. 3A
FIG. 3B

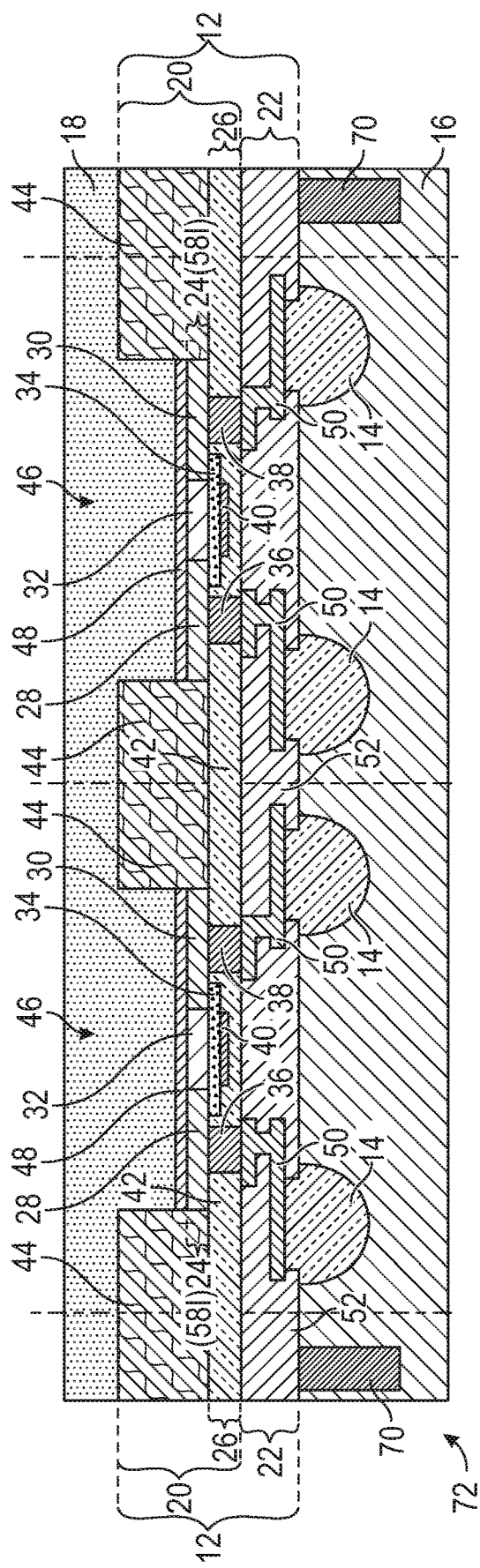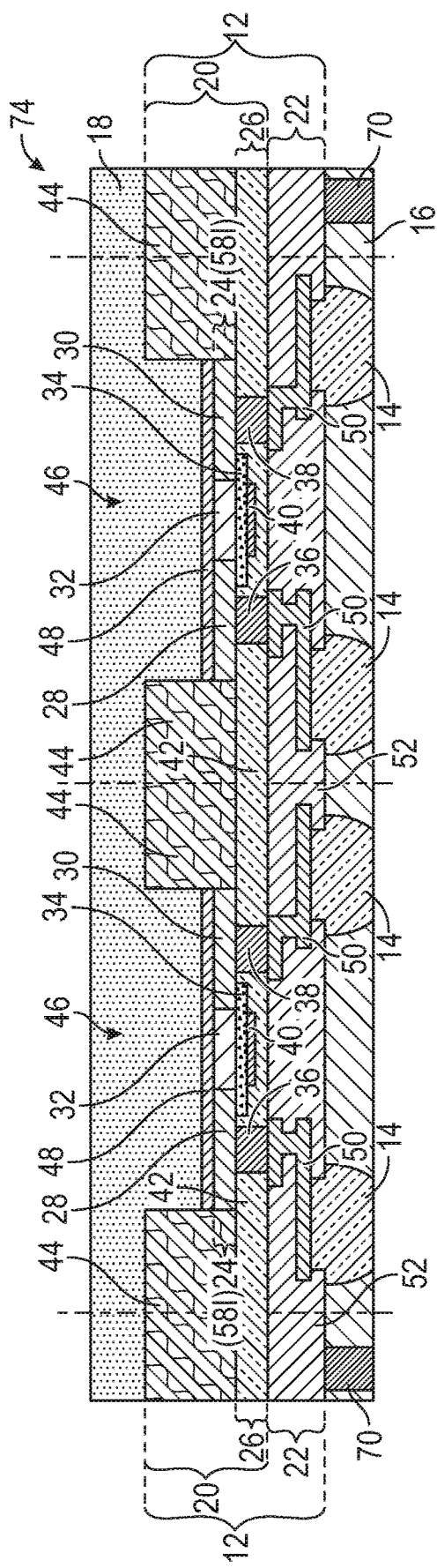

RF DEVICES WITH ENHANCED PERFORMANCE AND METHODS OF FORMING THE SAME

RELATED APPLICATIONS

This application claims the benefit of provisional patent application Ser. No. 62/692,945, filed Jul. 2, 2018, the disclosure of which is hereby incorporated herein by reference in its entirety.

This application is related to U.S. patent application Ser. No. 16/427,019, filed May 30, 2019, now published as U.S. patent application publication no. 2020/0235054 A1, entitled "RF DEVICE WITHOUT SILICON HANDLE SUBSTRATE FOR ENHANCED THERMAL AND ELECTRICAL PERFORMANCE AND METHODS OF FORMING THE SAME," the disclosure of which is hereby incorporated herein by reference in its entirety.

FIELD OF THE DISCLOSURE

The present disclosure relates to a radio frequency (RF) device and a process for making the same, and more particularly to an RF device with enhanced thermal and electrical performance, and a wafer-level packaging process to provide the RF device with enhanced performance.

BACKGROUND

The wide utilization of cellular and wireless devices drives the rapid development of radio frequency (RF) technologies. The substrates on which RF devices are fabricated play an important role in achieving high level performance in the RF technologies. Fabrications of the RF devices on conventional silicon handle substrates may benefit from low cost of silicon materials, a large scale capacity of wafer production, well-established semiconductor design tools, and well-established semiconductor manufacturing techniques.

Despite the benefits of using conventional silicon handle substrates for the RF device fabrications, it is well known in the industry that the conventional silicon handle substrates may have two undesirable properties for the RF devices: harmonic distortion and low resistivity values. The harmonic distortion is a critical impediment to achieve high level linearity in the RF devices built over silicon handle substrates. In addition, high speed and high performance transistors are more densely integrated in RF devices. Consequently, the amount of heat generated by the RF devices will increase significantly due to the large number of transistors integrated in the RF devices, the large amount of power passing through the transistors, and/or the high operation speed of the transistors. Accordingly, it is desirable to package the RF devices in a configuration for better heat dissipation.

To accommodate the increased heat generation of the RF devices and to reduce deleterious harmonic distortion of the RF devices, it is therefore an object of the present disclosure to provide an improved packaging process for enhanced thermal and electrical performance. Further, there is also a need to enhance the performance of the RF devices without increasing the package size.

SUMMARY

The present disclosure relates to a radio frequency (RF) device with enhanced thermal and electrical performance, and a process for making the same. The disclosed RF device includes a device region, a number of first bump structures, a first mold compound, and a second mold compound. The device region includes a back-end-of-line (BEOL) portion with a number of connecting layers, and a front-end-of-line (FEOL) portion residing over the BEOL portion. The FEOL portion includes an active layer, a contact layer, and isolation sections. Herein, both the active layer and the isolation sections reside over the contact layer. The active layer is surrounded by the isolation sections and does not extend vertically beyond the isolation sections. The first bump structures are formed at a bottom surface of the BEOL portion, and electrically coupled to the FEOL portion via the connecting layers within the BEOL portion. The first mold compound is formed over the bottom surface of the BEOL portion and partially encapsulates each first bump structure, such that a bottom portion of each first bump structure is not covered by the first mold compound. The second mold compound resides over the active layer of the FEOL portion without a silicon material, which has a resistivity between 5 Ohm-cm and 30000 Ohm-cm, in between.

In one embodiment of the RF device, a portion of the second mold compound resides over the isolation sections.

In one embodiment of the RF device, the isolation sections extend vertically beyond a top surface of the active layer to define an opening within the isolation sections and over the active layer, wherein the second mold compound fills the opening.

According to another embodiment, the RF device further includes a passivation layer directly over the top surface of the active layer and within the opening. Herein, the passivation layer is formed of silicon dioxide, silicon nitride, or combination of both, and in contact with the second mold compound.

According to another embodiment, the RF device further includes an interfacial layer directly over the top surface of the active layer and within the opening. Herein, the interfacial layer is formed of silicon germanium (SiGe) and directly connected to the second mold.

In one embodiment of the RF device, the second mold compound is in contact with the top surface of the active layer.

In one embodiment of the RF device, a top surface of each isolation section and a top surface of the active layer are coplanar. Herein, the second mold compound resides over both the active layer and the isolation sections.

According to another embodiment, the RF device further includes a number of second bump structures. Each second bump structure is in contact with a corresponding first bump structure, and protrudes from the first mold compound.

In one embodiment of the RF device, the second bump structures are formed from solder paste, conductive epoxy, or reflowable metals.

In one embodiment of the RF device, the first bump structures are solder balls or copper pillars.

In one embodiment of the RF device, the first mold compound is formed from a same material as the second mold compound. Herein, the first mold compound and the second mold compound have a thermal conductivity greater than 1 W/m·K, and a dielectric constant less than 8 or a dielectric constant between 3 and 5.

In one embodiment of the RF device, the first mold compound and the second mold compound are formed from different materials.

In one embodiment of the RF device, the first mold compound is transparent.

In one embodiment of the RF device, the FEOL portion is configured to provide at least one of a switch field effect transistor (FET), a diode, a capacitor, a resistor, and an inductor.

According to an exemplary process, a device wafer having a number of device dies is firstly provided. Herein, each device die includes first bump structures and a device region with a BEOL portion and a FEOL portion over the BEOL portion. The FEOL portion includes an active layer, a contact layer, and isolation sections. Herein, the active layer and the isolation sections reside over the contact layer, the isolation sections surround the active layer, and the active layer does not extend vertically beyond the isolation sections. A combination of a bottom surface of each BEOL portion forms a bottom surface of the device wafer. The first bump structures are formed at the bottom surface of each BEOL portion. In addition, an interfacial layer formed of SiGe, is directly over the active layer of each device die. A silicon handle substrate is directly over each interfacial layer. Next, a first mold compound is applied over the bottom surface of the device wafer to encapsulate the first bump structures of each device die. The silicon handle substrate is then removed completely. A second mold compound is formed over the active layer of each device die from where the silicon handle substrate is removed. There is no silicon material residing between the second mold compound and each active layer. After the second mold compound is formed, the first mold compound is thinned until exposing a bottom portion of each first bump structure.

According to another embodiment, the exemplary process further includes removing the interfacial layer before applying the second mold compound. Herein the active layer of each device die is in contact with the second mold compound after the second mold compound is applied.

According to another embodiment, the exemplary process further includes removing the interfacial layer and applying a passivation layer directly over the active layer of each device die before applying the second mold compound. Herein, the passivation layer is formed of silicon dioxide, silicon nitride, or combination of both. The passivation layer is in contact with the second mold compound after the second mold compound is applied.

According to another embodiment, the exemplary process further includes forming a number of second bump structures after thinning the first mold compound. Herein, each second bump structure is in contact with an exposed bottom portion of a corresponding first bump structure, and protrudes from the first mold compound.

According to another embodiment, the exemplary process further includes forming at least one window component at the periphery of the bottom surface of the device wafer before applying the first mold compound. Herein, the at least one window component is encapsulated by the first mold compound after the first mold compound is applied.

In one embodiment of the exemplary process, the at least one window component is taller than each first bump structure, such that the least one window component is exposed before the first bump structures during the thinning process.

In one embodiment of the exemplary process, providing the device wafer starts with providing a Si—SiGe—Si wafer that includes a common silicon epitaxial layer, a common interfacial layer over the common silicon epitaxial layer, and the silicon handle substrate over the common interfacial layer. The common interfacial layer is formed of SiGe. A complementary metal-oxide-semiconductor (CMOS) process is then performed to provide a precursor wafer that includes a number of device regions. Herein, the isolation sections extend through the common silicon epitaxial layer and the common interfacial layer, and extend into the silicon handle substrate, such that the common interfacial layer separates into a number of individual interfacial layers, and the common silicon epitaxial layer separates into a number of individual silicon epitaxial layers. Each active layer of the device regions is formed from a corresponding individual silicon epitaxial layer. Each individual interfacial layer directly resides over a top surface of a corresponding active layer, and the silicon handle substrate resides directly over the individual interfacial layers. Next, the first bump structures are formed at the bottom surface of each BEOL portion to complete the device dies from the device regions.

In one embodiment of the exemplary process, providing the device wafer starts with providing a Si—SiGe—Si wafer that includes a common silicon epitaxial layer, a common interfacial layer over the common silicon epitaxial layer, and the silicon handle substrate over the common interfacial layer. The common interfacial layer includes SiGe, and has a number of interfacial layers that are connected. A CMOS process is then performed to provide a precursor wafer that includes a number of device regions. Herein, the isolation sections extend through the common silicon epitaxial layer and extend into the common interfacial layer, such that the common silicon epitaxial layer separates into a number of individual silicon epitaxial layers and the interfacial layers remain connected. Each active layer of the device regions is formed from a corresponding individual silicon epitaxial layer. Each interfacial layer directly resides over a top surface of a corresponding active layer, and the silicon handle substrate remains directly over the common interfacial layer. Next, the first bump structures are formed at the bottom surface of each BEOL portion to complete the device dies from the device regions.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIG. 1 shows an exemplary radio frequency (RF) device with enhanced thermal and electrical performance according to one embodiment of the present disclosure.

FIGS. 2-13 provide an exemplary wafer-level packaging process that illustrates steps to fabricate the exemplary RF device shown in FIG. 1.

It will be understood that for clear illustrations, FIGS. 1-13 may not be drawn to scale.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

With the looming shortage of conventional radio frequency silicon on insulator (RFSOI) wafers expected in the coming years, alternative technologies are being devised to get around the need for high resistivity using silicon wafers, the trap rich layer formation, and Smart-Cut SOI wafer process. One of these alternative technologies is based on the use of a silicon germanium (SiGe) interfacial layer instead of a buried oxide layer (BOX) between a silicon substrate and a silicon epitaxial layer, however, which will also suffer from the deleterious distortion effects due to the silicon substrate, similar to what is observed in an RFSOI technology. The present disclosure, which relates to a radio frequency (RF) device with enhanced thermal and electrical performance, and a wafer-level packaging process for making the same, is based on this Si—SiGe—Si structure without deleterious distortion effects from the silicon substrate.

FIG. 1 shows an exemplary RF device 10 formed from a Si—SiGe—Si wafer (processing details are described in following paragraphs) according to one embodiment of the present disclosure. For the purpose of this illustration, the exemplary RF device 10 includes a device region 12, first bump structures 14, a first mold compound 16, and a second mold compound 18.

In detail, the device region 12 includes a front-end-of-line (FEOL) portion 20 and a back-end-of-line (BEOL) portion 22 underneath the FEOL portion 20. In one embodiment, the FEOL portion 20 is configured to provide a switch field-effect transistor (FET), and includes an active layer 24 and a contact layer 26. Herein, the active layer 24 has a source 28, a drain 30, and a channel 32 between the source 28 and the drain 30. The source 28, the drain 30, and the channel 32 are formed from a same silicon epitaxial layer. The contact layer 26 is formed underneath the active layer 24 and includes a gate structure 34, a source contact 36, a drain contact 38, and a gate contact 40. The gate structure 34 may be formed of silicon oxide, and extends horizontally underneath the channel 32 (from underneath the source 28 to underneath the drain 30). The source contact 36 is connected to and under the source 28, the drain contact 38 is connected to and under the drain 30, and the gate contact 40 is connected to and under the gate structure 34. An insulating material 42 may be formed around the source contact 36, the drain contact 38, the gate structure 34, and the gate contact 40 to electrically separate the source 28, the drain 30, and the gate structure 34. In different applications, the FEOL portion 20 may have different FET configurations or provide different device components, such as a diode, a capacitor, a resistor, and/or an inductor.

In addition, the FEOL portion 20 also includes isolation sections 44, which reside over the insulating material 42 of the contact layer 26 and surround the active layer 24. The isolation sections 44 are configured to electrically separate the RF device 10, especially the active layer 24, from other devices formed in a common wafer (not shown). Herein, the isolation sections 44 may extend from a top surface of the contact layer 26 and vertically beyond a top surface of the active layer 24 to define an opening 46 that is within the isolation sections 44 and over the active layer 24. The second mold compound 18 fills the opening 46 and may extend over the isolation sections 44. The isolation sections 44 may be formed of silicon dioxide, which may resist etching chemistries such as potassium hydroxide (KOH), sodium hydroxide (NaOH), and acetylcholine (ACH).

In some applications, the RF device 10 may further include a passivation layer 48, which is formed of silicon dioxide, silicon nitride, or combination of both, directly over the top surface of the active layer 24 and within the opening 46. As such, the second mold compound 18 is directly over the passivation layer 48. The passivation layer 48 is configured to terminate surface bonds of the active layer 24, which may be responsible for unwanted leakage. The passivation layer may also serve as a barrier and is configured to protect the active layer 24 from moisture or ionic contamination. If the passivation layer 48 is omitted, the second mold compound 18 may be in contact with the top surface of the active layer 24. In some applications, the RF device 10 may further include an interfacial layer (described in the following paragraphs and not shown herein), which is formed of SiGe, directly over the top surface of the active layer 24 and within the opening 46. As such, the second mold compound 18 may be directly over the interfacial layer. The interfacial layer is from the Si—SiGe—Si wafer (processing details are described in following paragraphs), which is used to fabricate the RF device 10. If the interfacial layer is omitted, the second mold compound 18 may be in contact with the top surface of the active layer 24. Notice that, regardless of the passivation layer 48 or the interfacial layer, silicon crystal, which has no germanium content, does not exist between the second mold compound 18 and the top surface of the active layer 24. Both the passivation layer 48 and the interfacial layer are silicon alloy.

Further, in some applications, a top surface of each isolation section 44 and the top surface of the active layer 24 are coplanar (not shown), and the opening 46 is omitted. The second mold compound 18 resides over both the active layer 24 and the isolation sections 44 of the FEOL portion 20. Note that the active layer 24 is never vertically beyond the isolation sections 44.

The BEOL portion 22 is underneath the FEOL portion 20 and includes multiple connecting layers 50 formed within dielectric layers 52. The first bump structures 14 are formed at a bottom surface of the BEOL portion 22, and electrically coupled to the FEOL portion 20 (the source contact 36 and the drain contact 38 in this illustration) via the connecting layers 50 of the BEOL portion 22. The first mold compound 16 is formed underneath the BEOL portion 22 and encapsulates sides of each first bump structure 14, such that a bottom portion of each first bump structure 14 is not covered by the first mold compound 16.

Herein, the first bump structures 14 do not protrude from a bottom surface of the first mold compound 16. In some applications, it would be desirable to have protruding structures at the bottom surface of the RF device 10 to facilitate and improve the reliability of die attaching (to the printed circuit board) operations. Therefore, the RF device 10 may further include a number of second bump structures 54. Each second bump structure 54 is in contact with a corresponding first bump structure 14, and protrudes from the bottom surface of the first mold compound 16. The first bump structures 14 may be solder balls or copper pillars. The second bump structures 54 may be formed from solder paste, conductive epoxy, or reflowable metals.

The heat generated in the device region 12 may travel upward to a bottom portion of the second mold compound 18, which is over the active layer 24, and then will pass downward through the device region 12 and the first bump structures 14, which will dissipate the heat. Further, the heat generated in the device region 12 may also travel directly through the first mold compound 16 to be conducted. It is therefore highly desirable to have high thermal conductivities of both the first and second mold compounds 16 and 18. The first mold compound 16 and the second mold compound 18 may have a thermal conductivity greater than 1 W/m·K, or greater than 10 W/m·K. In addition, the first mold compound 16 and the second mold compound 18 may have a low dielectric constant less than 8, or between 3 and 5 to yield low RF coupling. The first mold compound 16 may be formed of a same or different material as the second mold compound 18. In one embodiment, both the first mold compound 16 and the second mold compound 18 may be formed of thermoplastics or thermoset polymer materials, such as PPS (poly phenyl sulfide), overmold epoxies doped with boron nitride, alumina, carbon nanotubes, or diamond-like thermal additives, or the like. Further, the first mold compound 16 may be transparent, and may have a thickness between 25 μm and 500 μm (based on the size of the first bump structure 14). A thickness of the second mold compound 18 is based on the required thermal performance of the RF device 10, the device layout, the distance from the first bump structures 14, and as well as the specifics of the package and assembly. The second mold compound 18 may have a thickness between 200 μm and 500 μm.

FIGS. 2-13 provide an exemplary wafer-level packaging process that illustrates steps to fabricate the exemplary RF device 10 shown in FIG. 1. Although the exemplary steps are illustrated in a series, the exemplary steps are not necessarily order dependent. Some steps may be done in a different order than that presented. Further, processes within the scope of this disclosure may include fewer or more steps than those illustrated in FIGS. 2-13.

Figure 2:
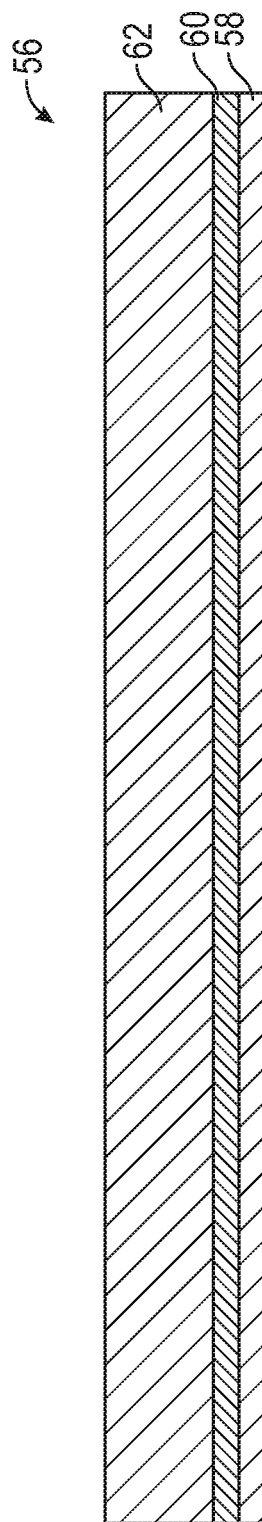

Initially, a Si—SiGe—Si wafer 56 is provided as illustrated in FIG. 2. The Si—SiGe—Si wafer 56 includes a common silicon epitaxial layer 58, a common interfacial layer 60 over the common silicon epitaxial layer 58, and a silicon handle substrate 62 over the common interfacial layer 60. Herein, the common interfacial layer 60, which is formed of SiGe, separates the common silicon epitaxial layer 58 from the silicon handle substrate 62.

Herein, the common silicon epitaxial layer 58 is formed from a device grade silicon material, which has desired silicon epitaxy characteristics to form electronic devices. The common interfacial layer 60 is formed from an alloy with any molar ratio of Si and Ge. The higher the Ge concentration, the better the etch selectivity between the silicon handle substrate 62 and the common interfacial layer 60, but also the more difficult the epitaxial growth of the common silicon epitaxial layer 58 becomes. In one embodiment, the common interfacial layer 60 may have a Ge concentration greater than 15% or greater than 25%. The Ge concentration may be uniform throughout the common interfacial layer 60. In some applications, the Ge concentration may be vertically graded (between 1% and 50%) so as to yield the necessary strain relief for the growth of the common silicon epitaxial layer 58. The silicon handle substrate 62 may consist of conventional low cost, low resistivity, and high dielectric constant silicon. The common silicon epitaxial layer 58 has higher resistivity than the silicon handle substrate 62, and the common silicon epitaxial layer 58 has lower harmonic generation than the silicon handle substrate 62. A thickness of the common silicon epitaxial layer 58 may be between 700 nm and 2000 nm, a thickness of the common interfacial layer 60 may be between 100 nm and 1000 nm, and a thickness of the silicon handle substrate 62 may be between 200 μm and 500 μm.

Next, a complementary metal-oxide-semiconductor (CMOS) process is performed to the Si—SiGe—Si wafer 56 to provide a precursor wafer 64 with a number of device regions 12, as illustrated in FIG. 3A. For the purpose of this illustration, the FEOL portion 20 of each device region 12 is configured to provide a switch FET. In different applications, the FEOL portion 20 may have different FET configurations or provide different device components, such as a diode, a capacitor, a resistor, and/or an inductor.

In this embodiment, the isolation sections 44 of each device region 12 extend through the common silicon epitaxial layer 58 and the common interfacial layer 60, and extend into the silicon handle substrate 62. As such, the common interfacial layer 60 separates into a number of individual interfacial layers 601, and the common silicon epitaxial layer 58 separates into a number of individual silicon epitaxial layers 581, each of which is used to form a corresponding active layer 24 in one device region 12.

The top surface of the active layer 24 is in contact with a corresponding interfacial layer 601. The silicon handle substrate 62 resides over each individual interfacial layer 601, and portions of the silicon handle substrate 62 may reside over the isolation sections 44. The BEOL portion 22 of the device region 12, which includes at least the multiple connecting layers 50 and the dielectric layers 52, is formed under the FEOL portion 20. Bottom portions of certain connecting layers 50 are exposed through the dielectric layers 52 at the bottom surface of the BEOL portion 22.

In another embodiment, the isolation sections 44 do not extend into the silicon handle substrate 62. Instead, the isolation sections 44 only extend through the common silicon epitaxial layer 58 and extend into the common interfacial layer 60, as illustrated in FIG. 3B. Herein, the common interfacial layer 60 remains continuous, and the individual interfacial layers 601 are connected with each other. The common interfacial layer 60 directly resides over the top surface of each active layer 24, and directly resides over a top surface of each isolation section 44. The silicon handle substrate 62 remains over the common interfacial layer 60. Further, the isolation sections 44 may extend through the common silicon epitaxial layer 58 but do not extend into the common interfacial layer 60. The top surface of each isolation section 44 and the top surface of each active layer 24 may be coplanar (not shown). The common interfacial layer 60 is over each isolation section 44 and each active layer 24, and the silicon handle substrate 62 remains over the common interfacial layer 60.

Figure 4:
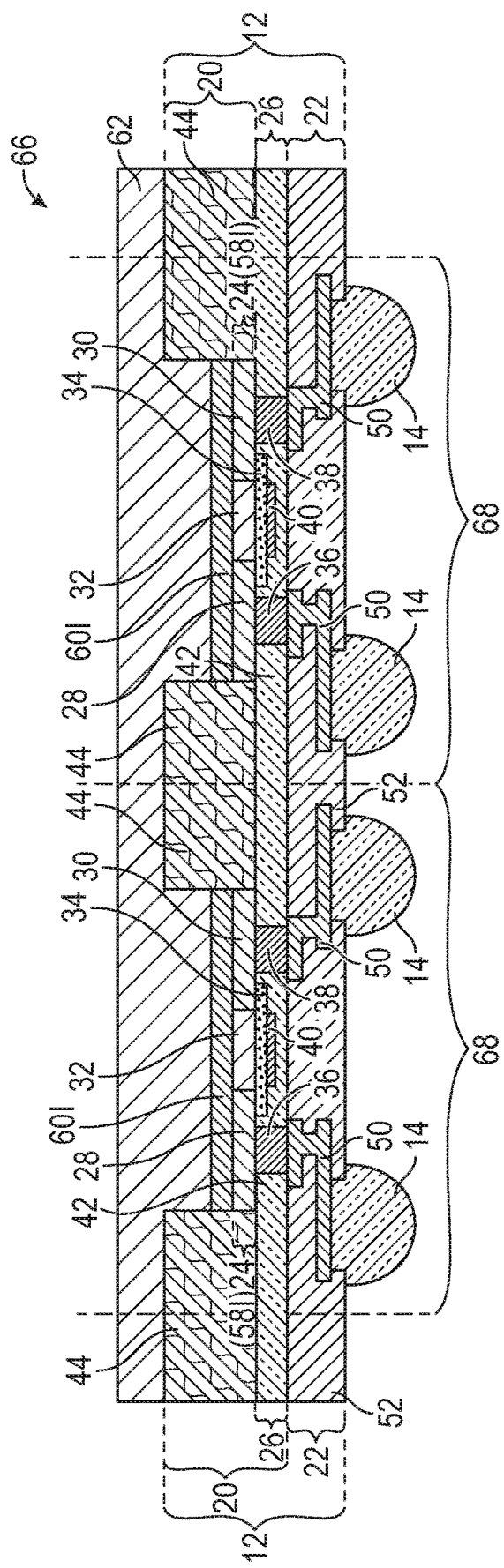

The first bump structures 14 are then formed at the bottom surface of each BEOL portion 22 to provide a device wafer 66, as depicted in FIG. 4. A combination of the bottom surface of each BEOL portion 22 forms a bottom surface of the device wafer 66. The device wafer 66 includes a number of device dies 68, each of which further includes the first bump structures 14 compared to the device region 12. Each first bump structure 14 is in contact with the exposed portion of a corresponding connecting layer 50. Herein, the first bump structures 14 are electrically coupled to the FEOL portion 20 (the source contact 36 and the drain contact 38 in this illustration) via the connecting layers 50 of the BEOL portion 22. The first bump structures 14 may be formed by a solder ball bumping technology or a copper pillar packaging technology. Each first bump structure 14 protrudes from the bottom surface of the BEOL portion 22 between 20 μm and 350 μm.

Figure 5:
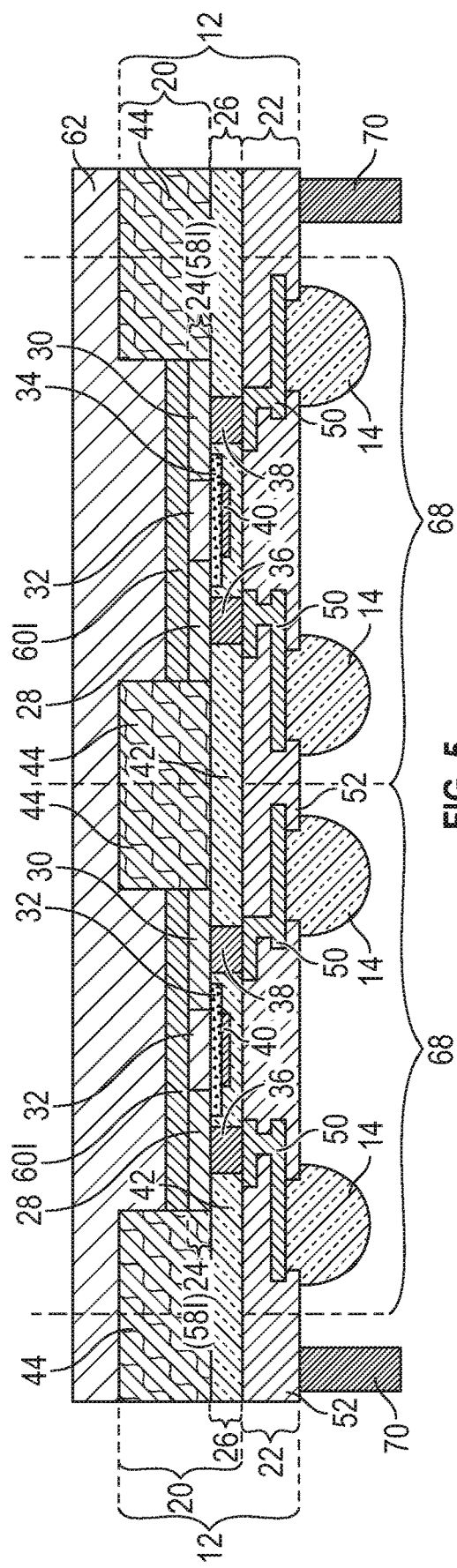

Next, at least one window component 70 may be formed at the bottom surface of one BEOL portion 22 where the wafer mark(s) (not shown) is/are located, as illustrated in FIG. 5. Herein, the wafer mark indicates the key location(s) of a wafer, which will be utilized for alignment in a following singulation and/or an assembly process. In one embodiment, the at least one window component 70 is located at the periphery of the bottom surface of the device wafer 66. The at least one window component 70 may be formed of a transparent material (for instance: transparent silicone material), such that the wafer mark will be seen through the at least one window component 70. In addition, at least one window component 70 may be formed of an easily removable material (for instance: acrylic polymer), such that the wafer mark will be seen after an easy removal of the at least one window component 70 (more details in following discussion). The at least one window component 70 has a height greater than each first bump structure 14 and is not connected to any first bump structure 14. Notice that the at least one window component 70 is optional. In some applications, forming the at least one window component 70 at the bottom surface of one BEOL portion 22 may be omitted.

Figures 6, 7:
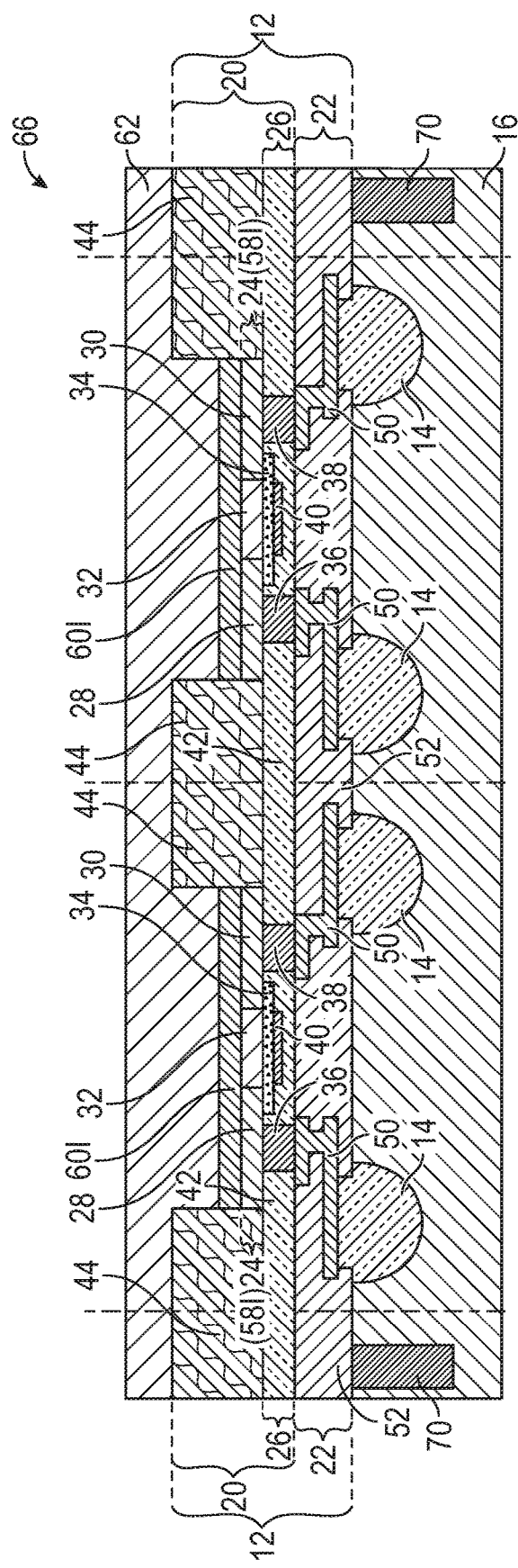

The first mold compound 16 is applied over the bottom surface of the device wafer 66 and encapsulates each first bump structure 14 and the at least one window component 70, as illustrated in FIG. 6. The first mold compound 16 may be applied by various procedures, such as compression molding, sheet molding, overmolding, transfer molding, dam fill encapsulation, or screen print encapsulation. The first mold compound 16 may have a superior thermal conductivity greater than 1 W/m·K, or greater than 10 W/m·K, and may have a dielectric constant less than 8, or between 3 and 5. The first mold compound 16 may have a thickness between 25 μm and 500 μm. The first mold compound 16 may resist etching chemistries such as KOH, NaOH, and ACH. In some applications, the first mold compound 16 may be formed of a transparent material. As such, there is no need to form the at least one window component 70 at the bottom surface of the BEOL portion 22, because all locations of a wafer may be seen through the first mold compound 16. A curing process (not shown) is then used to harden the first mold compound 16. The curing temperature is between 100° C. and 320° C. depending on which material is used as the first mold compound 16.

After the first mold compound 16 is formed, the silicon handle substrate 62 is selectively removed to provide an etched wafer 72, where the selective removal is stopped on each interfacial layer 601, as illustrated in FIG. 7. If the isolation sections 44 extend vertically beyond the interfacial layers 601, the removal of the silicon handle substrate 62 will provide the opening 46 over each active layer 24 and within the isolation sections 44. Removing the silicon handle substrate 62 may be provided by chemical mechanical grinding and an etching process with a wet/dry etchant chemistry, which may be TMAH, KOH, NaOH, ACH, or XeF2, or provided by the etching process itself. As an example, the silicon handle substrate 62 may be ground to a thinner thickness to reduce the following etching time. An etching process is then performed to completely remove the remaining silicon handle substrate 62. Since the silicon handle substrate 62 and the interfacial layers 601 have different characteristics, they may have different reactions to a same etching technique (for instance: different etching speeds with a same etchant). Consequently, the etching system is capable of identifying the presence of the interfacial layers 601, and capable of indicating when to stop the etching process.

During the removal process, the isolation sections 44 are not removed and thus protect each FEOL portion 20. The first mold compound 16 protects the bottom surface of each BEOL portion 22. Herein, the top surface of each isolation section 44 and the top surface of each interfacial layer 601 are exposed after the removing process. If the isolation sections 44 extend into the common interfacial layer 60 (as shown in FIG. 3B), or the top surface of each isolation section 44 and the top surface of each active layer 24 are coplanar (not shown), only the top surface of the common interfacial layer 60 will be exposed (not shown).

Figure 8:
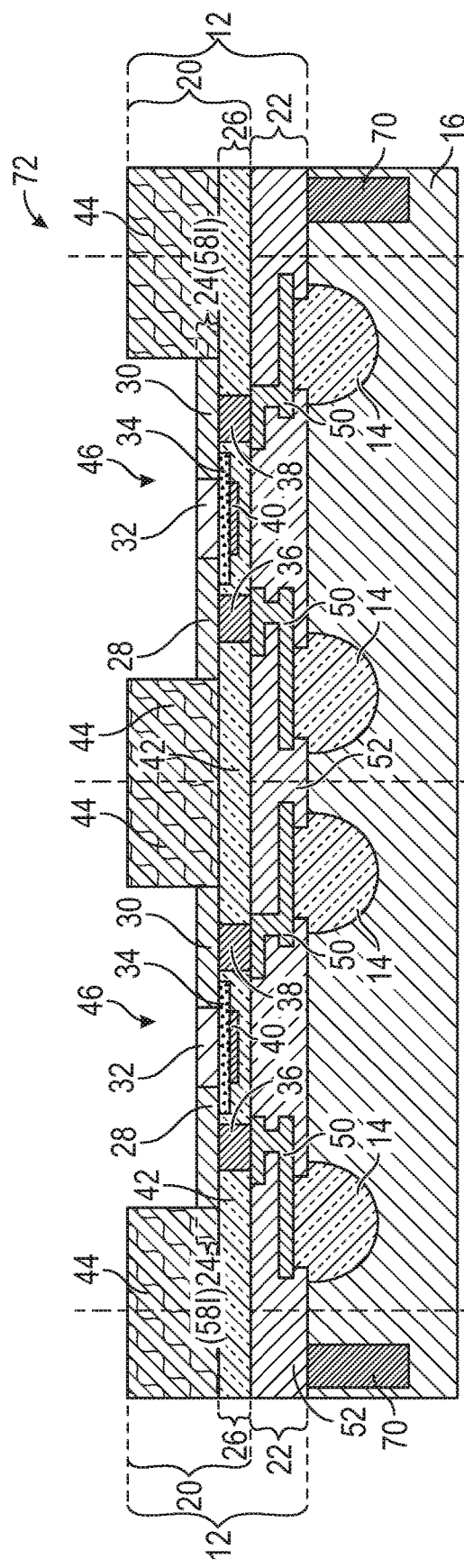

Due to the narrow gap nature of the SiGe material, it is possible that the interfacial layers 601 (or the common interfacial layer 60) may be conducting. The interfacial layer 601 may cause appreciable leakage between the source 28 and the drain 30 of the active layer 24. Therefore, in some applications, such as FET applications, it is desired to also remove the interfacial layers 601 (or the common interfacial layer 60), as illustrated in FIG. 8. The interfacial layers 601 may be removed by the same etching process used to remove the silicon handle substrate 62, or may be removed by another etching process, such as HCl dry etch systems. If the interfacial layer 601 is thin enough, it may be completely depleted and may not cause any appreciable leakage between the source 28 and the drain 30 of the FEOL portion 20. In that case, the interfacial layers 601 may be left intact.

Figure 9:
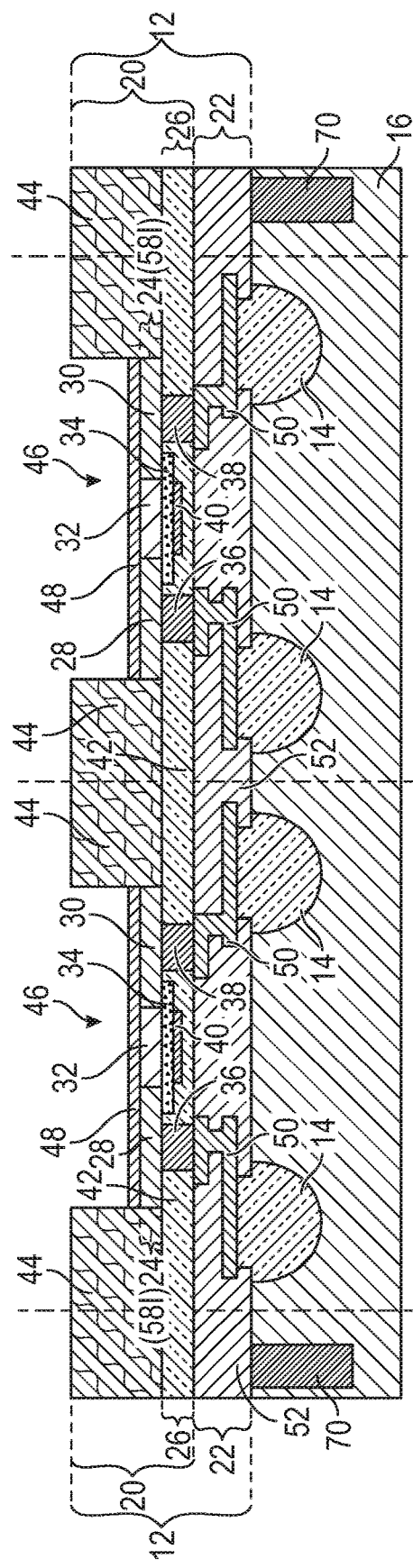

In some applications, the passivation layer 48, which may be formed of silicon dioxide, silicon nitride, or combination of both, may be formed directly over the active layer 24 of each FEOL portion 20, as illustrated in FIG. 9. If there is one opening 46 over each active layer 24 and within the isolation sections 44, the passivation layer 48 is within the opening 46. The passivation layer 48 is configured to terminate the surface bonds at the top surface of the active layer 24, which may be responsible for unwanted leakage. The passivation layer 48 may be formed by CVD dielectric filming or passivating plasma.

The second mold compound 18 is then applied over the etched wafer 72 as illustrated in FIG. 10. Herein, the second mold compound 18 fills each opening 46 and is in contact with the passivation layer 48 within the opening 46. In addition, portions of the second mold compound 18 may extend over the isolation sections 44. If there is no passivation layer 48 formed in each opening 46, the second mold compound 18 is in contact with the top surface of each active layer 24 (not shown). If the interfacial layer 601 remains over the top surface of each active layer 24, the second mold compound 18 is in contact with the interfacial layer 601 (not shown). The second mold compound 18 always resides over each active layer 24.

The second mold compound 18 may be applied by various procedures, such as compression molding, sheet molding, overmolding, transfer molding, dam fill encapsulation, and screen print encapsulation. During the molding process of the second mold compound 18, the first mold compound 16 provides mechanical strength and rigidity to the etched wafer 72. A curing process (not shown) is followed to harden the second mold compound 18. The curing temperature is between 100° C. and 320° C. depending on which material is used as the second mold compound 18. After the curing process, the second mold compound 18 may be thinned and/or planarized (not shown).

Next, the first mold compound 16 is thinned to provide a mold device wafer 74 as illustrated in FIG. 11. Herein, the first mold compound encapsulates sides of the each first bump structure 14 and the bottom portion of each first bump structure 14 is exposed. In addition, since the at least one window component 70 has a height greater than each first bump structure 14, a bottom portion of the at least one window component 70 is also exposed through the first mold compound 16. The thinning procedure may be done with a mechanical grinding process. In one embodiment, the at least one window component 70 may be formed of a transparent material, such that the wafer mark indicating the key location(s) of a wafer will be seen through the at least one window component 70. In another embodiment, the at least one window component 70 may be formed of an opaque material, such that the wafer mark indicating the key location(s) of a wafer will not be seen through the at least one window component 70. An extra step of removing the at least one window component 70 is needed to expose the wafer mark indicating the key location(s) of a wafer (not shown).

Figure 12:
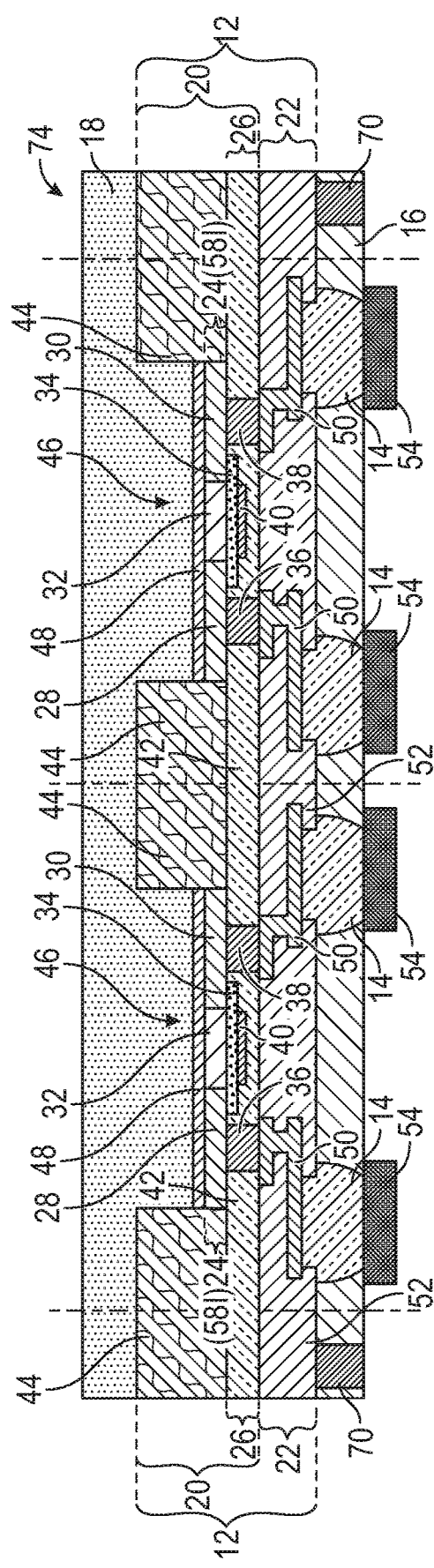
Figure 13:
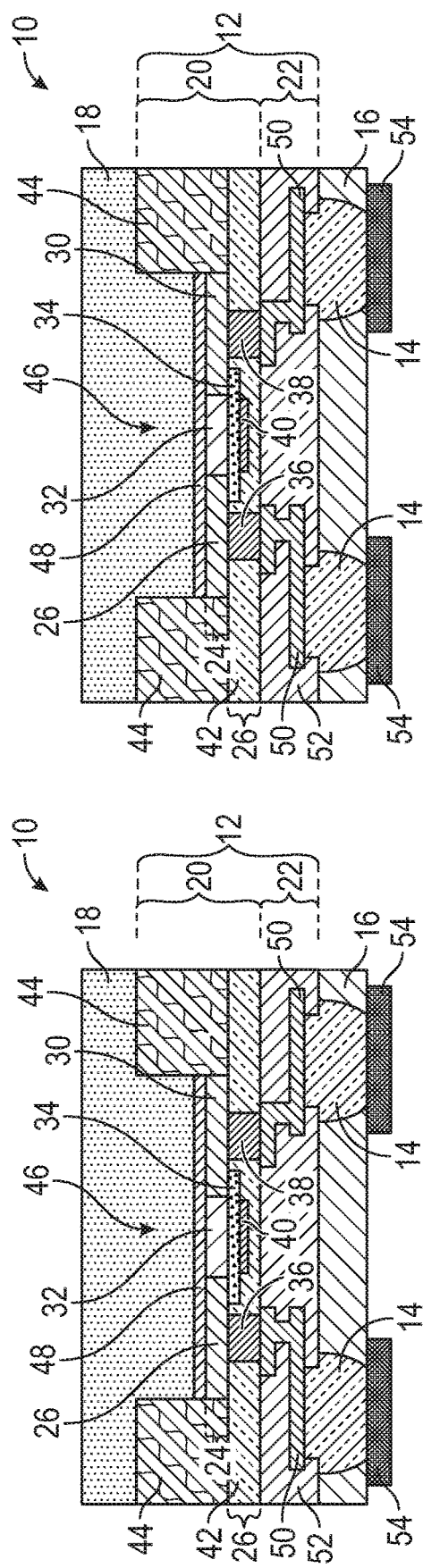

Further, in some applications, the second bump structures 54 may be formed after the first mold compound 16 is thinned, as illustrated in FIG. 12. Each second bump structure 54 is directly connected to a corresponding first bump structure 14, electrically coupled to the corresponding FEOL portion 20, and protrudes from the bottom surface of the first mold compound 16. Finally, the mold device wafer 74 is singulated into individual RF devices 10, as illustrated in FIG. 13. The singulating step may be provided by a probing and dicing process at certain isolation sections 44. The individual RF device 10 may be assembled on the PCB using a number of die attaching methods.

Those skilled in the art will recognize improvements and modifications to the preferred embodiments of the present disclosure. All such improvements and modifications are considered within the scope of the concepts disclosed herein and the claims that follow.

What is claimed is:
1. An apparatus comprising:
a device region including a back-end-of-line (BEOL) portion and a front-end-of-line (FEOL) portion residing over the BEOL portion, wherein:
the BEOL portion comprises a plurality of connecting layers;
the FEOL portion comprises an active layer, a contact layer, and isolation sections; and
the active layer and the isolation sections reside over the contact layer, wherein the isolation sections surround the active layer and extend vertically beyond a top surface of the active layer to define an opening within the isolation sections and over the active layer;
a plurality of first bump structures formed at a bottom surface of the BEOL portion, wherein the plurality of first bump structures is electrically coupled to the FEOL portion via the plurality of connecting layers;
a first mold compound formed over the bottom surface of the BEOL portion and partially encapsulating each of the plurality of first bump structures, wherein a bottom portion of each of the plurality of first bump structures is not covered by the first mold compound; and
a second mold compound residing over the active layer of the FEOL portion to fill the opening, wherein:
silicon crystal, which has no germanium content, does not exist between the second mold compound and the active layer; and
a portion of the second mold compound resides over the isolation sections.

2. The apparatus of claim 1 further comprising a passivation layer directly over the top surface of the active layer and within the opening, wherein:
the passivation layer is formed of silicon dioxide, silicon nitride, or combination of both; and
the second mold compound is in contact with the passivation layer.

3. The apparatus of claim 1 further comprising an interfacial layer directly over the top surface of the active layer and within the opening, wherein:
the interfacial layer is formed of silicon germanium (SiGe); and
the second mold compound is in contact with the interfacial layer.

4. The apparatus of claim 1 wherein the second mold compound is in contact with the top surface of the active layer.

5. The apparatus of claim 1 wherein the plurality of first bump structures are solder balls or copper pillars.

6. The apparatus of claim 1 wherein the first mold compound and the second mold compound are formed from different materials.

7. The apparatus of claim 1 wherein the first mold compound is transparent.

8. The apparatus of claim 1 wherein the FEOL portion is configured to provide at least one of a switch field-effect transistor (FET), a diode, a capacitor, a resistor, and an inductor.

9. The apparatus of claim 1 further comprising a plurality of second bump structures, wherein each of the plurality of second bump structures is in contact with a corresponding one of the plurality of first bump structures, and protrudes from the first mold compound.

10. The apparatus of claim 9 wherein the plurality of second bump structures are formed from solder paste, conductive epoxy, or reflowable metals.

11. The apparatus of claim 1 wherein the first mold compound is formed from a same material as the second mold compound.

12. The apparatus of claim 11 wherein the first mold compound and the second mold compound have a thermal conductivity greater than 1 W/mm·K.

13. The apparatus of claim 11 wherein the first mold compound and the second mold compound have a dielectric constant less than 8.

14. The apparatus of claim 11 wherein the first mold compound and the second mold compound have a dielectric constant between 3 and 5.

* * * * *